United States Patent
Zhao et al.

(10) Patent No.: US 11,356,066 B1
(45) Date of Patent: Jun. 7, 2022

(54) DIGITAL COMMUNICATIONS CIRCUITS AND SYSTEMS

(71) Applicant: XILINX, INC., San Jose, CA (US)

(72) Inventors: Hongzhi Zhao, Los Gatos, CA (US); Xiaohan Chen, Sunnyvale, CA (US); Hemang Parekh, San Jose, CA (US)

(73) Assignee: XILINX, INC., San Jose, CA (US)

( * ) Notice: Subject to any disclaimer, the term of this patent is extended or adjusted under 35 U.S.C. 154(b) by 6 days.

(21) Appl. No.: 16/903,378

(22) Filed: Jun. 17, 2020

(51) Int. Cl.
*H04B 1/04* (2006.01)
*H03F 1/32* (2006.01)
*H04L 27/36* (2006.01)

(52) U.S. Cl.
CPC ......... *H03F 1/3288* (2013.01); *H03F 1/3247* (2013.01); *H03F 1/3294* (2013.01); *H04B 1/0475* (2013.01); *H04L 27/368* (2013.01); *H03F 2201/3224* (2013.01); *H03F 2201/3233* (2013.01); *H04B 2001/0425* (2013.01)

(58) Field of Classification Search
CPC .......... H04B 1/0475; H04B 2201/0425; H04L 27/368; H03F 1/3288; H03F 1/3247; H03F 1/3294; H03F 2201/3224; H03F 2201/3233
USPC ........................................................ 375/297
See application file for complete search history.

(56) References Cited

U.S. PATENT DOCUMENTS

| | | | |
|---|---|---|---|
| 7,737,779 | B2 | 6/2010 | Summerfield et al. |
| 7,741,906 | B1 | 6/2010 | Summerfield |
| 7,746,167 | B1 | 6/2010 | Summerfield |
| 8,229,025 | B1 | 7/2012 | Summerfield |
| 8,243,852 | B1 | 8/2012 | Summerfield |
| 8,285,770 | B1 | 10/2012 | Barnes et al. |
| 8,737,523 | B2 | 5/2014 | Barnes |
| 8,837,633 | B2 | 9/2014 | Dick |
| 9,014,241 | B2 | 4/2015 | Dick |
| 9,172,409 | B2 | 10/2015 | Copeland |
| 9,337,886 | B1 | 5/2016 | Dick |
| 9,338,039 | B1 | 5/2016 | Barnes |
| 9,455,760 | B1 | 9/2016 | Dick et al. |
| 9,590,567 | B2 | 3/2017 | Zhao et al. |
| 9,866,269 | B1 * | 1/2018 | Zhao ................. H04L 25/03847 |
| 2010/0232482 | A1 * | 9/2010 | Murali .................... H04B 1/034 375/219 |

OTHER PUBLICATIONS

Jardel O. et al., "An Electrothermal Model for AlGaN/GaN Power HEMTs Including Trapping Effects to Improve Large-Signal Simulation Results on High VSWR", IEEE Transactions On Microwave Theory and Techniques, vol. 55, No. 12, Dec. 2007, pp. 2660-2669.
Benvegnu, Agostino, "Trapping and Reliability Investigations in GaN-based HEMTs", 164 pages, Sep. 28, 2016.

* cited by examiner

*Primary Examiner* — Kevin M Burd
(74) *Attorney, Agent, or Firm* — Patterson + Sheridan, LLP

(57) ABSTRACT

Described examples provide for digital communication circuits and systems that implement digital pre-distortion (DPD). In an example, a system includes a DPD circuit configured to compensate an input signal for distortions resulting from an amplifier. The DPD circuit includes an infinite impulse response (IIR) filter configured to implement a transfer function. The IIR filter includes a selection circuit configured to selectively output a selected parameter. The transfer function is based on the selected parameter.

18 Claims, 11 Drawing Sheets

DIGITAL COMMUNICATIONS CIRCUITS AND SYSTEMS

TECHNICAL FIELD

Examples of the present disclosure generally relate to digital communication circuits and systems and, in particular, to digital communication circuits implementing digital pre-distortion (DPD) processing and systems including such circuits.

BACKGROUND

Power amplifiers are generally used in communication systems, such as wireless communication systems, to provide a desired gain to a signal that is being transmitted. Further, power amplifiers can provide a mechanism for load matching of the medium on which a signal is to be transmitted. However, amplifiers used in communication systems can cause challenges. Linearity of output responses of an amplifier may be relatively limited. Digital pre-distortion (DPD) can be used to enhance linearity of output response of a power amplifier.

SUMMARY

Examples described herein provide for digital communication circuits and systems that implement digital pre-distortion (DPD). The DPD can be implemented with, among other things, one or more infinite impulse response (IIR) filters that selectively implements parameters in the transfer function of the respective IIR filter. In some examples, by selectively implementing parameters, non-linearities caused by an amplifier having different time constants based on differing modes of the amplifier can be compensated, which can cause a signal to be pre-distorted in a manner such that a corresponding received signal is truer to the original signal.

An example is a system for communications. The system includes a DPD circuit configured to compensate an input signal for distortions resulting from an amplifier. The DPD circuit includes an IIR filter configured to implement a transfer function. The IIR filter includes a selection circuit configured to selectively output a selected parameter. The transfer function is based on the selected parameter.

Another example is a method of processing for transmission. Digital pre-distortion is performed on an input signal. An intermediate signal resulting from performing the digital pre-distortion is communicated towards an amplifier. Performing the digital pre-distortion includes: inputting a first signal through an IIR filter and outputting a second signal from the IIR filter. The first signal is based on the input signal. The second signal is based on the first signal and a transfer function of the IIR filter. The IIR filter includes a selection circuit configured to selectively output a selected parameter. The transfer function is based on the selected parameter.

A further example of the present disclosure is a system. The system includes a DPD circuit. The DPD circuit is configured to compensate an input signal for distortions resulting from an amplifier. The DPD circuit includes a first IIR filter configured to receive a first signal, to implement a first transfer function, and to output a second signal based on the first transfer function and the first signal. The first IIR filter includes a first difference circuit and a first selection circuit. The first difference circuit is configured to generate a first difference signal that is a difference between the first signal and the second signal. The first selection circuit is configured to selectively output a first parameter or a second parameter as a first selected parameter based on a sign bit of the first difference signal. The first transfer function is based on the first selected parameter.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
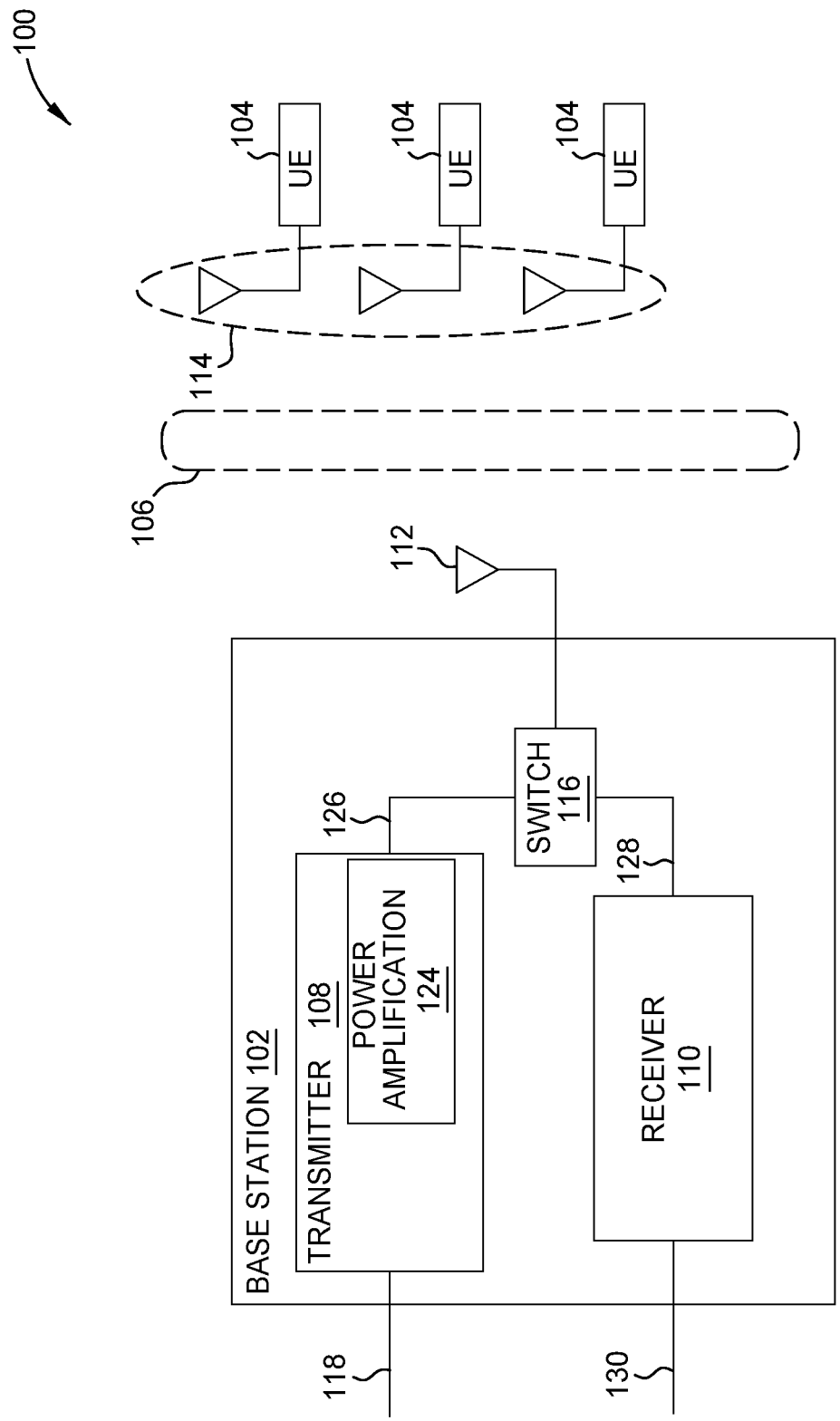
FIG. 1 is a block diagram depicting an example communication system where a power amplification unit including a digital pre-distortion (DPD) system may be used according to some examples.

Examples described herein provide for digital communication circuits and systems that implement digital pre-distortion (DPD). The DPD can be implemented with, among other things, one or more infinite impulse response (IIR) filters that selectively implement parameters in the respective transfer function of the IIR filter. In some examples, by selectively implementing parameters, non-linearities caused by an amplifier having different time constants based on differing modes of the amplifier can be compensated, which can cause a signal to be pre-distorted in a manner such that a corresponding received signal is truer to the original signal.

Generally, DPD processing is implemented to compensate for a non-linear response of an amplifier used in communications. Power amplifiers (PAs) are typically implemented in communication systems and are inherently non-linear. Non-linearity in PAs causes spectral growth beyond the signal bandwidth of a particular channel, which interferes with adjacent channels. It also causes distortions within the signal bandwidth, causing an increased bit error rate at a receiver. In, for example, a gallium nitride (GaN) based PA, distortions can be caused by long term memory effects associated with deep electron trap effects. Even further, modeling of distortions in such PAs can change based on the state of voltages within the PA. A GaN based PA can be modeled by a gate-lag model and a drain-lag model. In each of these models, a response by the GaN based PA to signals can change based on a gate-to-source voltage or a drain-to-source voltage relative to a charge voltage of charges trapped in the PA. A response can change based on changing modeled resistance-capacitance (RC) time constants in the PA.

In some examples, a DPD system can, in compensating for memory effects in PAs, compensate for changing RC time constants of a PA. Some examples can implement one or more IIR filters in a DPD circuit, and the one or more IIR filters can implement respective selection circuits. A selection circuit can selectively output a selected parameter that is implemented in the transfer function of the IIR filter. The selected parameter can correspond to the appropriate time constant of the PA such that the DPD circuit can compensate for non-linearities caused by the changing time constants of the response of the PA. DPD can pre-distort a signal to be transmitted to effectively extend a linear response of the amplifier.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a block diagram depicting an example communication system 100 where a power amplification unit including a DPD system may be used. Communication system 100 includes a base station 102 and user equipment (UE) units 104. More than one UE unit 104 may be communicatively coupled to base station 102 at a time. UE units 104 may be communicatively coupled to base station 102 via over-the-air (e.g., wireless) communication channel 106 using antennas 112 and 114.

In some examples, communication system 100 is for bidirectional communication, namely a downlink for sending information from base station 102 to UE units 104, and an uplink for sending information from UE units 104 to base station 102. The base station 102 includes a transmitter 108 configured to receive an input signal at an input node 118 for transmission. The transmitter 108 includes a power amplification unit 124, which may amplify a signal to be transmitted and generates a signal at output node 126. The signal on output node 126 is then sent, via a switch 116, to the antenna 112 for transmission. As such, power amplification unit 124 drives the antenna 112 for transmitting the signal on the output node 126 via wireless communication channel 106. The base station 102 may further include a receiver 110, which receives a signal at an input node 128 from antenna 112 via the switch 116, performs an uplink process, and outputs a signal on an output node 130.

Communication system 100 may deploy various transmission schemes, for example, frequency division duplex (FDD) and time division duplex (TDD). In some examples where TDD (e.g., according to a TDD-Long-Term Evolution (LTE) standard) is deployed, the uplink is separated from downlink by the allocation of different time slots for uplink and downlink in the same frequency band. As illustrated in FIG. 1, in such examples, a duplexer (e.g., a switch 116) may be used to switch between uplink and downlink according to the allocated time slots. Time slots allocated to downlink may be referred to as transmit time slots, and time slots allocated to uplink may be referred to as receive time slots.

Figure 2:
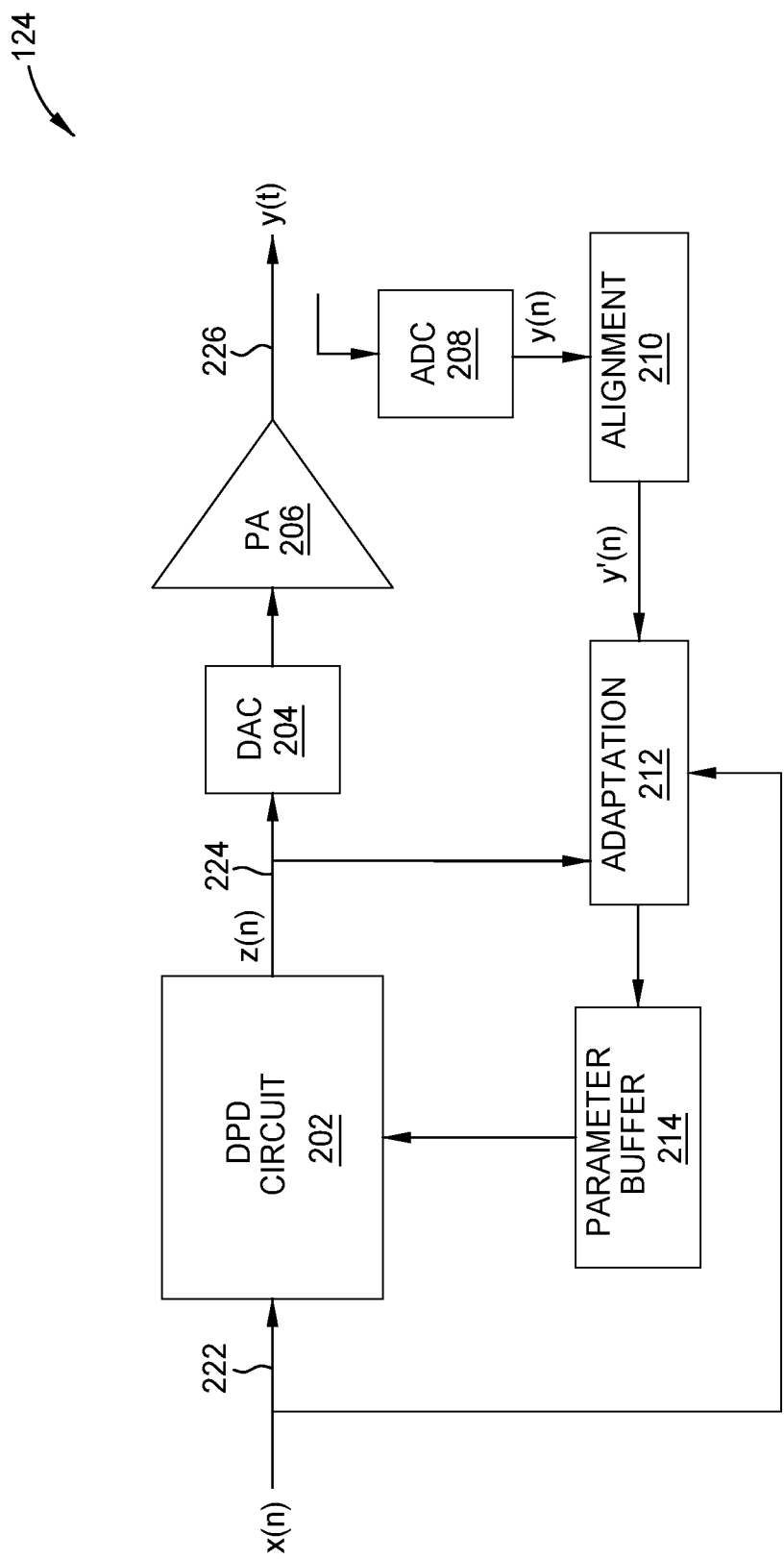
FIG. 2 illustrates an example power amplification unit including a DPD circuit for compensating for distortion according to some examples.

FIG. 2 illustrates an example power amplification unit 124 including a DPD circuit 202 for compensating for distortion. The power amplification unit 124 includes the DPD circuit 202, a digital-to-analog converter (DAC) 204, a PA 206, an analog-to-digital converter (ADC) 208, an alignment circuit 210, an adaptation circuit 212, and a parameter buffer 214. Other components may be included in the power amplification unit 124 that are not illustrated in FIG. 2 for clarity. For example, radio frequency (RF) mixers can be included to step-up and/or step down signals to and/or from an RF signal. Generally, the DPD circuit, DAC 204, and PA 206 are coupled to receive a digital input signal x(n), process the digital input signal x(n), and generate and transmit an analog output signal y(t). Generally, the ADC 208, alignment circuit 210, adaptation circuit 212, and parameter buffer 214 form a feedback path to determine parameters implemented by the DPD circuit 202.

The DPD circuit 202 is configured to receive the digital input signal x(n) at an input node 222 of the DPD circuit 202 and generate a digital intermediate signal z(n) on an output node of the DPD circuit 202 (which is an intermediate node 224 of the power amplification unit 124). The digital intermediate signal z(n) is a modified version of the digital input signal x(n). The digital intermediate signal z(n) can be a distorted version of the digital input signal x(n) that pre-distorts the digital input signal x(n) to compensate for distortions introduced by the PA 206. The output node of the DPD circuit 202 is coupled to an input node of the DAC 204. The DAC 204 is configured to receive the digital intermediate signal z(n) at the input node of the DAC 204, convert the digital intermediate signal z(n) to an analog signal, and output the analog version of the digital intermediate signal z(n) on an output node of the DAC 204. The output node of the DAC 204 is coupled to an input node of the PA 206. The PA 206 is configured to receive the analog version of the digital intermediate signal z(n) (or another signal based on the digital intermediate signal z(n), such as an RF signal that is the digital intermediate signal z(n) stepped up to a RF) at the input node of the PA 206, apply a gain to the signal, and output the analog output signal y(t) on an output node of the PA 206 (which is an output node 226 of the power amplification unit 124).

The analog output signal y(t) output by the PA 206 and on the output node 226 is fed back to an input node of the ADC 208. The ADC 208 is configured to receive the analog output signal y(t) at the input node of the ADC 208, convert the analog output signal y(t) to a digital output signal y(n), and output the digital output signal y(n) on an output node of the ADC 208. The output node of the ADC 208 is coupled to an input node of the alignment circuit 210. The alignment circuit 210 is configured to receive the digital output signal y(n), match the amplitude, delay, and phase variations of the digital output signal y(n) to the digital intermediate signal z(n), and generate an aligned digital output signal y'(n). The alignment circuit 210 can include a mixer to mix a detected phase difference in the digital output signal y(n) to generate the aligned digital output signal y'(n). The alignment circuit 210 is configured to output the aligned digital output signal y'(n) on an output node of the alignment circuit 210, which is coupled to an input node of the adaptation circuit 212.

The adaptation circuit 212 is configured to capture a predetermined number of samples of data of the aligned digital output signal y'(n) (e.g., by using a sampling coupler). The adaptation circuit 212 has input nodes coupled to the input node 222 and intermediate node 224 of the power amplification unit 124. The adaptation circuit 212 can be configured to capture a predetermined number of samples of data of the digital intermediate signal z(n) on the intermediate node 224 (e.g., by using a sampling coupler). The adaptation circuit 212 can be configured to capture a predetermined number of samples of data of the digital input signal x(n) on the input node 222 (e.g., by using a sampling coupler). The adaptation circuit 212 is configured to determine parameters of the DPD circuit 202 based on the digital input signal x(n), digital intermediate signal z(n), and/or aligned digital output signal y'(n). In some examples, the parameters may be stored in the parameter buffer 214, and provided to the DPD circuit 202. The parameters may be coefficients of various functions, for example, functions that modify the digital input signal x(n), such that the digital intermediate signal z(n) of the DPD circuit 202 compensates for the distortion of the PA 206.

In some examples, the power amplification unit 124 may include a mixer (e.g., an up converter) coupled between the output node of the DAC 204 and the input node of the PA 206. In some examples, an up converter may receive the analog signal from the DAC 204 and convert it to an RF analog signal, which is then provided to the PA 206. The PA 206 may provide an amplified RF output signal. In some examples, the power amplification unit 124 may include a mixer (e.g., a down converter) to convert the RF output signal to an intermediate frequency (IF) or baseband (BB) analog signal that is sampled to generate a digital sampled signal, which is then provided to the input node of the alignment circuit 210 or adaptation circuit 212.

In various examples, the adaptation circuit 212 may use various numerical techniques for generating the parameters used in the DPD circuit 202. For example, discrete characterization events, where the coefficients are found that best match the PA 206 during some period of samples duration may be employed. For further example, least mean squares estimation over a fixed block of samples may be used. However, any suitable method for generating parameters for a DPD circuit 202 may be used.

In various examples, the DPD circuit 202 is implemented based on PA behavior models (also referred to as PA models) of the PA 206. After determining the PA models which model the non-linearity of the PA 206, the inverse of such PA models may be applied to the digital input signal x(n) by the DPD circuit 202, thereby compensating for the non-linearity of the PA 206.

In some examples, the PA model is a memoryless PA model without any memory effect. Such memoryless model may include, for example, a polynomial model and Saleh's model. A DPD path implemented based on such a memoryless PA model may be referred to as a memoryless DPD path.

In some examples, the PA model is a memory PA model which considers memory effects of the PA. Memory effects of the PA may be classified as short term memory effects and long term memory effects according to time constants of the memory effects. In some examples, short term memory effects may have time constants of the order of carrier signal period (e.g., several times of the carrier signal period). In some examples, time constants of the short-term memory effects are of the order of nanoseconds. Long term memory effects may have a lower frequency (e.g., in a range between a few kilohertz (kHz) to megahertz (MHz)) and/or larger time constants than those of short term memory effects. In some examples, time constants of the long-term memory effects are of the order of microseconds, milliseconds, or greater.

In some examples, a PA model with short term memory effects may include, for example, memory polynomial model and Volterra model. A DPD path implemented based on such a PA model with short term memory effect may be referred to as a short term memory effect DPD path.

In some examples, a DPD path implemented based on such a PA model with long term memory effects may be referred to as a long term memory effect DPD path. Such a DPD path may include one or more IIR filters to compensate for the long term memory effects of the PA.

In some examples, the PA 206 is associated with one or more PA models including, for example, memoryless PA model, PA model with short term memory effects, PA model with long term memory effects, or a combination thereof. The DPD circuit 202 may include a plurality of parallel DPD paths, where the DPD paths correspond to the plurality of PA models respectively. In an example, DPD circuit 202 includes a plurality of parallel DPD paths including, for example, memoryless DPD path, short term memory effect DPD path, and long term memory effect DPD path.

In some examples, the PA 206 can be a gallium nitride (GaN) based PA, and the DPD circuit 202 may be configured to compensate for long term memory effects of the GaN based PA. The GaN based PA can include a GaN high electron mobility transistor (GaN-HEMT). A GaN-HEMT may show long term memory effects due to its deep electron trap effects, where the density of its traps may change versus the output power of the GaN based PA. In some examples, a communication system using a GaN based PA is an LTE-TDD system. In such a communication system, the GaN based PA may be turned on during downlink time slots, and be turned off during uplink time slots. After the GaN based PA is turned on during downlink time slots, the deep electron traps may experience slow charging and discharging processes. As such, a non-linear behavior model of the GaN based PA changes slowly during this turning-on time period (transient period), even when the PA output power is constant. Therefore, a digital predistortion model based on a memoryless PA model and/or a PA model with short term memory effects alone may not be sufficient to compensate for the non-linearity in a GaN based PA.

In some examples and as described in additional detail below, IIR filters can be implemented in the DPD circuit 202 to model the non-linear gain changes of the GaN based PA over the PA output power. The long term memory effects of the GaN based PA may include, for example, a gate-lag effect, a drain-lag effect, and a thermal effect. A GaN based PA may have a plurality of long term memory effects (e.g., a gate lag effect and a drain lag effect) associated with the electron traps, because a plurality of energy levels may be involved in the trapping effects of the GaN based PA. Different IIR filters may be configured to compensate for different memory effects of the GaN based PA.

Additionally, non-linearity effects of a GaN based PA can result from changing time constants of responses of the GaN based PA due to the gate-lag effect and drain-lag effect. The gate-lag effect and drain-lag effect have been modeled in a gate-lag model and a drain-lag model, respectively. These models show that small signal responses of a GaN based PA can vary based on voltages applied in the PA. In these models, an RC time constant can change, which can, during operation, change a transfer function of the GaN based PA and introduce non-linearities.

Figure 3:
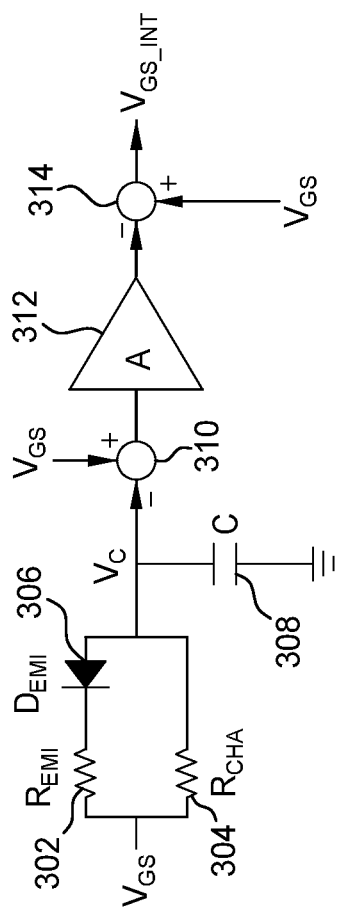
FIG. 3 illustrates a gate-lag model of a gallium nitride (GaN) based power amplifier (PA).

FIG. 3 illustrates a gate-lag model of a GaN based PA. An input node, on which a source-to-gate voltage $V_{GS}$ is applied, is connected to respective first terminals of resistor ($R_{EMI}$) 302 and resistor ($R_{CHA}$) 304. The second terminal of the resistor 302 (opposite from the first terminal) is connected to a cathode of a diode ($D_{EMI}$) 306. The second terminal of the resistor 304 (opposite from the first terminal) is connected to a anode of the diode 306, which is further connected to a first terminal of a capacitor (C) 308 and a negative input node of an subtractor 310. A capacitor voltage $V_C$ is on the node to which the anode of the diode 306, second terminal of the resistor 304, first terminal of the capacitor 308, and negative input node of the subtractor 310 are connected. A second terminal of the capacitor 308 is connected to a ground node. The source-to-gate voltage $V_{GS}$ is applied to a positive input node of the subtractor 310. An output node of the subtractor 310 is connected to an input node of an amplifier 312. An output node of the amplifier 312 is connected to a negative input node of a subtractor 314. The source-to-gate voltage $V_{GS}$ is applied to a positive input node of the subtractor 314. An output node of the subtractor 314 is an output node of the model on which an intermediate source-to-gate voltage $V_{GS\_INT}$ is applied.

As can be seen from this model in FIG. 3, whether the resistor ($R_{EMI}$) 302 forms part of the effective resistance of the model, and hence, forms part of the RC time constant of the model, depends on whether the source-to-gate voltage $V_{GS}$ is less than the capacitor voltage $V_C$. The capacitor 308 models the charge trapping effect in the model, and accumulated charge on the capacitor 308 results in the capacitor voltage $V_C$. An emission mode occurs when the source-to-gate voltage $V_{GS}$ is less than the capacitor voltage $V_C$ such that previously accumulated charge on the capacitor 308 is discharged. When the source-to-gate voltage $V_{GS}$ is less than the capacitor voltage $V_C$ in an emission mode, the diode 306 is conducting, and the effective resistance of the model is the resistance formed by the resistor ($R_{EMI}$) 302 and resistor ($R_{CHA}$) 304 being connected in parallel. A charging mode occurs when the source-to-gate voltage $V_{GS}$ is greater than the capacitor voltage $V_C$ such that the capacitor 308 accumulates charge. When the source-to-gate voltage $V_{GS}$ is not less than the capacitor voltage $V_C$ in a charging mode, the diode 306 is not conducting, and the effective resistance of the model is the resistance of resistor ($R_{CHA}$) 304. Mathematically, this can be generally expressed for a time constant τ as follows:

$$V_{GS}<V_C:\tau=\tau_{EMI}=(R_{CHA}\|R_{EMI})*C$$

$$V_{GS}\geq V_C:\tau=\tau_{CHA}=R_{CHA}*C$$

Figure 4:
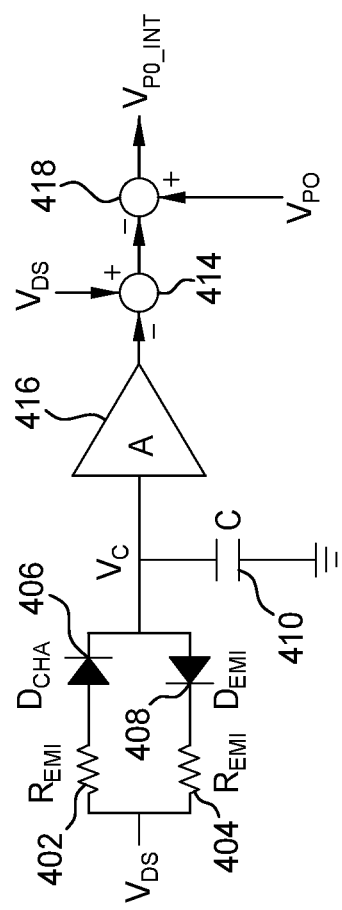
FIG. 4 illustrates a drain-lag model of a GaN based PA.

FIG. 4 illustrates a drain-lag model of a GaN based PA. An input node, on which a drain-to-source voltage $V_{DS}$ is applied, is connected to respective first terminals of resistor ($R_{CHA}$) 402 and resistor ($R_{EMI}$) 404. The second terminal of the resistor 402 (opposite from the first terminal) is connected to an anode of a diode ($D_{CHA}$) 406. The second terminal of the resistor 404 (opposite from the first terminal) is connected to a cathode of a diode ($D_{EMI}$) 408. A cathode of the diode 406 is connected to an anode of the diode 408, which is further connected to a first terminal of a capacitor (C) 410 and an input node of an amplifier 412. A capacitor voltage $V_C$ is on the node to which the cathode of the diode 406, anode of the diode 408, first terminal of the capacitor 410, and input node of an amplifier 412 are connected. A second terminal of the capacitor 410 is connected to a ground node. An output node of the amplifier 412 is connected to a negative input node of a subtractor 414. The drain-to-source voltage $V_{DS}$ is applied to a positive input node of the subtractor 414. An output node of the subtractor 414 is connected to an input node of an amplifier 416. An output node of the amplifier 416 is connected to a negative input node of a subtractor 418. A voltage $V_{P0}$ is applied to a positive input node of the subtractor 418. An output node of the subtractor 418 is an output node of the model on which an intermediate voltage $V_{P0\_INT}$ is applied.

As can be seen from this model in FIG. 4, whether the resistor ($R_{CHA}$) 402 and resistor ($R_{EMI}$) 404 form part of the effective resistance of the model, and hence, forms part of the RC time constant of the model, depends on whether the drain-to-source voltage $V_{DS}$ is less than or greater than the capacitor voltage $V_C$. The capacitor 410 models the charge trapping effect in the model, and accumulated charge on the capacitor 410 results in the capacitor voltage $V_C$. An emission mode occurs when the drain-to-source voltage $V_{DS}$ is less than the capacitor voltage $V_C$ such that previously accumulated charge on the capacitor 410 is discharged. When the drain-to-source voltage $V_{DS}$ is less than the capacitor voltage $V_C$ in an emission mode, the diode 406 is not conducting, and the diode 408 is conducting. Under such circumstances, the effective resistance of the model is the resistance of the resistor ($R_{EMI}$) 404. A charging mode occurs when the drain-to-source voltage $V_{DS}$ is greater than the capacitor voltage $V_C$ such that the capacitor 410 accumulates charge. When the capacitor voltage $V_C$ is less than drain-to-source voltage $V_{DS}$ in a charging mode, the diode 406 is conducting, and the diode 408 is not conducting. Under such circumstances, the effective resistance of the model is the resistance of resistor ($R_{CHA}$) 402. Mathematically, this can be generally expressed for a time constant τ as follows:

$$V_{DS}<V_C:\tau=\tau_{EMI}=R_{EMI}*C$$

$$V_{DS}>V_C:\tau=\tau_{CHA}=R_{CHA}*C$$

Figure 5:
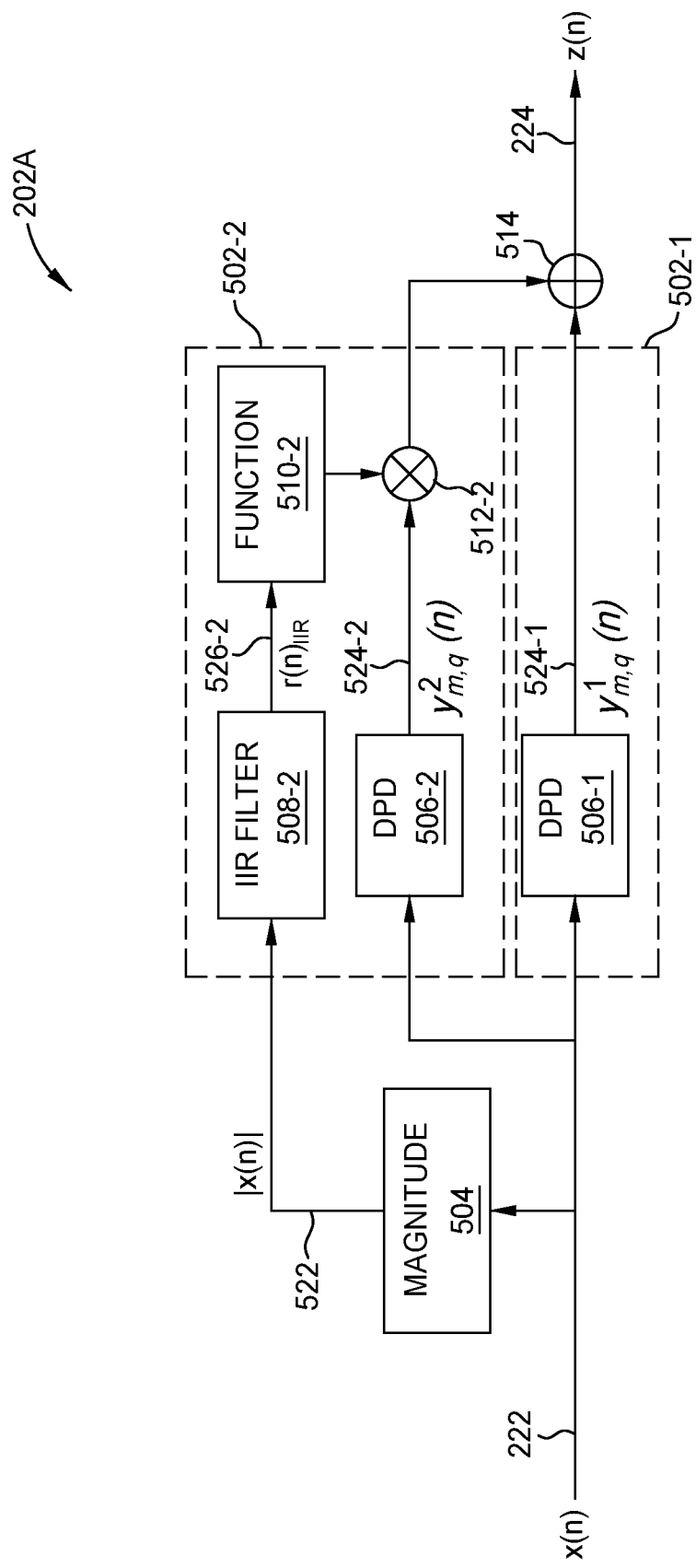
FIGS. 5 and 6 are schematics of DPD circuits that can be implemented as the DPD circuit of FIG. 2 according to some examples.
Figure 6:
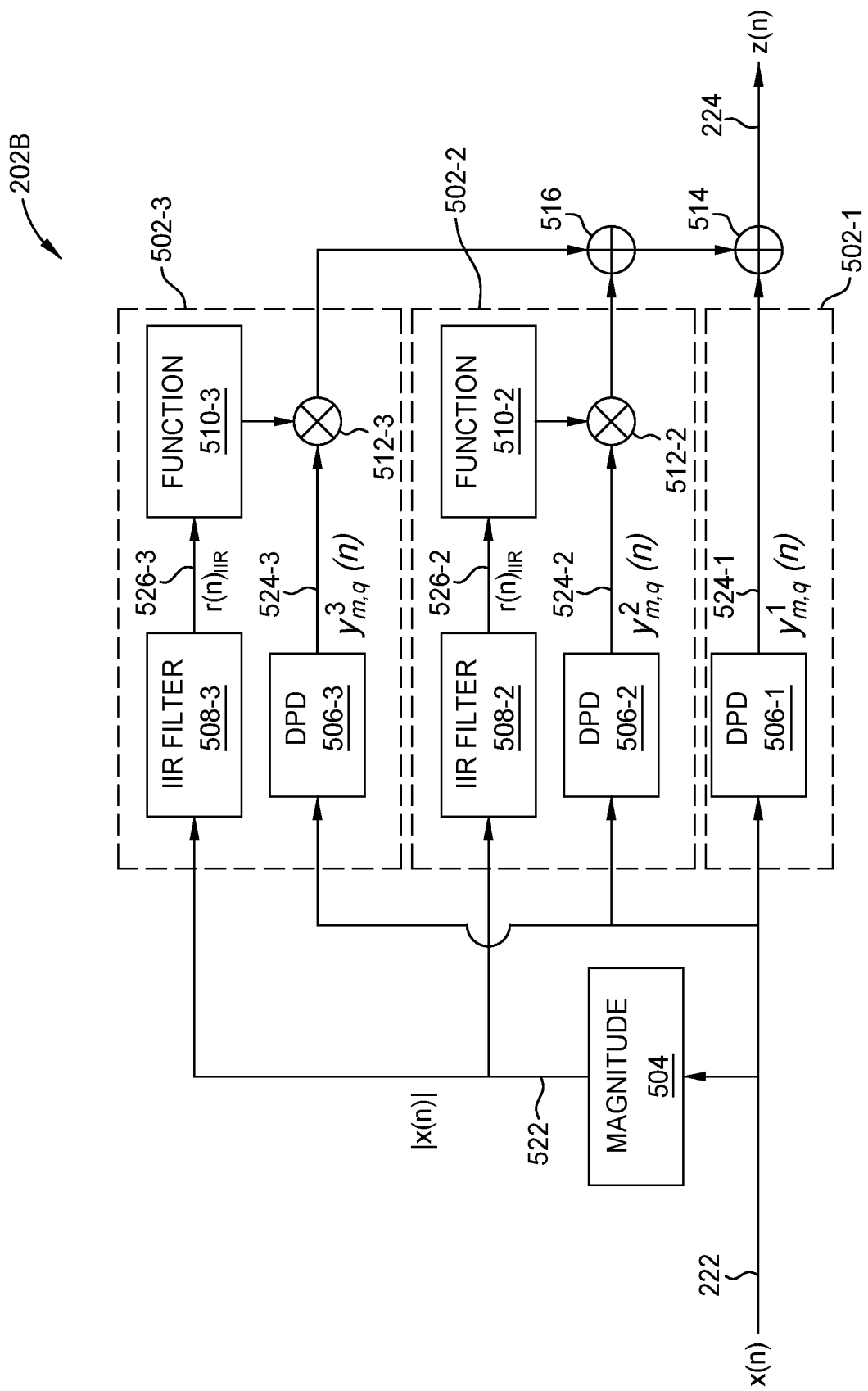

FIGS. 5 and 6 illustrates respective schematics of DPD circuits 202A, 202B that can be implemented as the DPD circuit 202 of FIG. 2 according to some examples. In some examples, the DPD circuits 202A, 202B can compensate for short term memory effects and long term memory effects in the PA 206, as well as differing time constants in a response of the PA 206. The DPD circuits 202A, 202B have differing numbers of paths that each can pre-distort a signal according to a predetermined model, and the signals output by the paths can be combined to form the digital intermediate signal z(n).

Referring to FIG. 5, the DPD circuit 202A includes a first path 502-1 (of index 1) and a second path 502-2 (of index 2). Further, the DPD circuit 202A includes magnitude logic 504, a DPD sub-circuit 506-1 in the first path 502-1, a DPD sub-circuit 506-2 in the second path 502-2, an IIR filter 508-2 in the second path 502-2, a compensation function circuit 510-2 in the second path 502-2, a multiplier 512-2 in the second path 502-2, and an adder 514. The input node 222, on which the DPD circuit 202A receives the digital input signal x(n), is coupled to respective input nodes of the magnitude logic 504 and DPD sub-circuits 506-1, 506-2. An output node 524-1 of the DPD sub-circuit 506-1 is coupled to an input node of the adder 514. An output node 524-2 of the DPD sub-circuit 506-2 is coupled to an input node of the multiplier 512-2. An output node of the magnitude logic 504 is coupled to an input node 522 of the IIR filter 508-2. An output node 526-2 of the IIR filter 508-2 is coupled to an input node of the compensation function circuit 510-2. An output node of the compensation function circuit 510-2 is coupled to another input node of the multiplier 512-2. An output node of the multiplier 512-2 is coupled to another input node of the adder 514. An output node of the adder 514 is coupled to the intermediate node 224 of the power amplification unit 124.

The DPD sub-circuit 506-1 can be configured to compensate for short term memory effects of the PA 206. The DPD sub-circuit 506-1, in some examples, is configured to receive the digital input signal x(n), process the digital input signal x(n) to compensate for the short term memory effects, and output a distorted signal $y_{m,q}^1(n)$ to the respective input node of the adder 514. The DPD sub-circuit 506-1 may be implemented based on a memory polynomial model to compensate for short term memory effects of the PA 206. Such short term memory effects may be caused by reactive components of active devices and matching networks of the PA 206. In some examples, the adaptation circuit 212 may adaptively configure the DPD sub-circuit 506-1 (e.g., to model the short term memory effects of the PA 206) via a plurality of parameters and/or coefficients for the DPD sub-circuit 506-1, which can be stored in the parameter buffer 214. For example, the parameters may include coefficients for a memory polynomial model used by the DPD sub-circuit 506-1.

The magnitude logic 504, DPD sub-circuit 506-2, IIR filter 508-2, compensation function circuit 510-2, and multiplier 512-2 can be configured to compensate for long term memory effects of the PA 206 and changes to effective time constants of the PA 206. The DPD sub-circuit 506-2, in some examples, is configured to receive the digital input signal x(n), process the digital input signal x(n) to compensate for memoryless or short term memory effects, and output a distorted signal $y_{m,q}^2(n)$ to the respective input node of the multiplier 512-2 that is coupled to the output node of the DPD sub-circuit 506-2. The DPD sub-circuit 506-2 may be implemented based on a memoryless polynomial model or Volterra model to compensate for memoryless or short term memory effects of the PA 206. In some examples, the adaptation circuit 212 may adaptively configure the DPD sub-circuit 506-2 (via a plurality of parameters for the DPD sub-circuit 506-2, which can be stored in the parameter buffer 214. For example, the parameters may include coefficients for a memory polynomial model used by the DPD sub-circuit 506-2.

The magnitude logic 504 is configured to receive the digital input signal x(n), generate a magnitude signal |x(n)| that is a magnitude of the digital input signal x(n), and output the magnitude signal |x(n)| to the input node 522, which is coupled to the input node of the IIR filter 508. The magnitude logic 504 (and any magnitude logic subsequently described) can determine the magnitude signal |x(n)| by determining the square root of the sum of the real part of the signal input to the magnitude logic 504 squared and the imaginary part of the signal input to the magnitude logic 504 squared (e.g., generally, $|x|=\sqrt{(Re\{x\})^2+(Im\{x\})^2}$). The IIR filter 508-2 is configured to receive the magnitude signal |x(n)|, pass the magnitude signal |x(n)| through the transfer function of the IIR filter 508-2, and output a digital response signal $r(n)_{IIR}$ to the output node 526-2. The transfer function of the IIR filter 508-2 can selectively implement parameters that compensate for changes of time constants in the response of the PA 206. In the example of FIG. 5, the IIR filter 508 can implement parameters that compensate for time constant changes according to one or both of the gate-lag model and drain-lag model of FIGS. 3 and 4. In some examples, the adaptation circuit 212 may adaptively configure the IIR filter 508-2 (via a plurality of parameters for the IIR filter 508-2, which can be stored in the parameter buffer 214. For example, the parameters may include time constants used by the IIR filter 508-2. Various example IIR filters are described in further detail below.

The compensation function circuit 510-2 is configured to receive the digital response signal $r(n)_{IIR}$, pass the digital response signal $r(n)_{IIR}$ through the transfer function of compensation function circuit 510-2, and output a response signal to the respective input node of the multiplier 512-2. The transfer function of the compensation function circuit 510-2 can be configured to compensate for any effects. In some examples, the transfer function of the compensation function circuit 510-2 is one (e.g., the compensation function circuit 510-2 merely passes the digital response signal $r(n)_{IIR}$). In some examples, the compensation function circuit 510-2 can be dynamic, and the adaptation circuit 212 may adaptively configure the compensation function circuit 510-2 (via one or more parameters for the compensation function circuit 510-2, which can be stored in the parameter buffer 214).

The multiplier 512-2 is configured to multiply the signals output by the DPD sub-circuit 506-2 and the compensation function circuit 510-2 and to output the resulting signal to the respective input of the adder 514. The adder 514 is configured to add the signals output by the DPD sub-circuit 506-1 and the multiplier 512-2 (e.g., the signals output by the first path 502-1 and the second path 502-2) and to output the resulting digital intermediate signal z(n) to the intermediate node 224 of the power amplification unit 124.

Referring to FIG. 6, the DPD circuit 202B includes the first path 502-1, the second path 502-2, and a third path 502-3 (of index 3). The third path 502-3 includes a DPD sub-circuit 506-3 (with output node 524-3), an IIR filter 508-3 (with an output node 526-3), a compensation function circuit 510-3, and a multiplier 512-3 configured like corresponding components in the second path 502-2.

The DPD circuit 202B further includes an adder 516. Output nodes of the multipliers 512-2, 512-3 are coupled to respective input nodes of the adder 516. The adder 516 is configured to receive and add signals output by the multipliers 512-2, 512-3 (e.g., output signals of paths 502-2, 502-3), and output a resulting signal. An output node of the adder 516 is coupled to an input node of the adder 514. The adder 514 is configured to receive and add signals output by the adder 516 and the DPD sub-circuit 506-1 (e.g., an output signal of the first path 502-1) and output the resulting digital intermediate signal z(n) to the intermediate node 224 of the power amplification unit 124. The configuration to add signals output by the paths 502-1, 502-2, 502-3 to obtain the digital intermediate signal z(n) can be modified, as a person having ordinary skill in the art will readily understand.

In the example of FIG. 6, the IIR filter 508-2 can implement parameters that compensate for time constant changes according to the gate-lag model of FIG. 3, and the IIR filter 508-3 can implement parameters that compensate for time constant changes according to the drain-lag model of FIG. 4.

In description that follows, components illustrated in and described with respect to FIGS. 5 and 6 may be generically referenced without reference to the corresponding path index. For example, a DPD sub-circuit 506 (with output node 524) below can refer to any one or each of the DPD sub-circuits 506-1, 506-2, 506-3 (with output nodes 524-1, 524-2, 524-3, respectively), and an IIR filter 508 (with output node 526) below can refer to any one or each of the IIR filters 508-2, 508-3 (with output nodes 526-2, 526-3, respectively).

Figure 7:
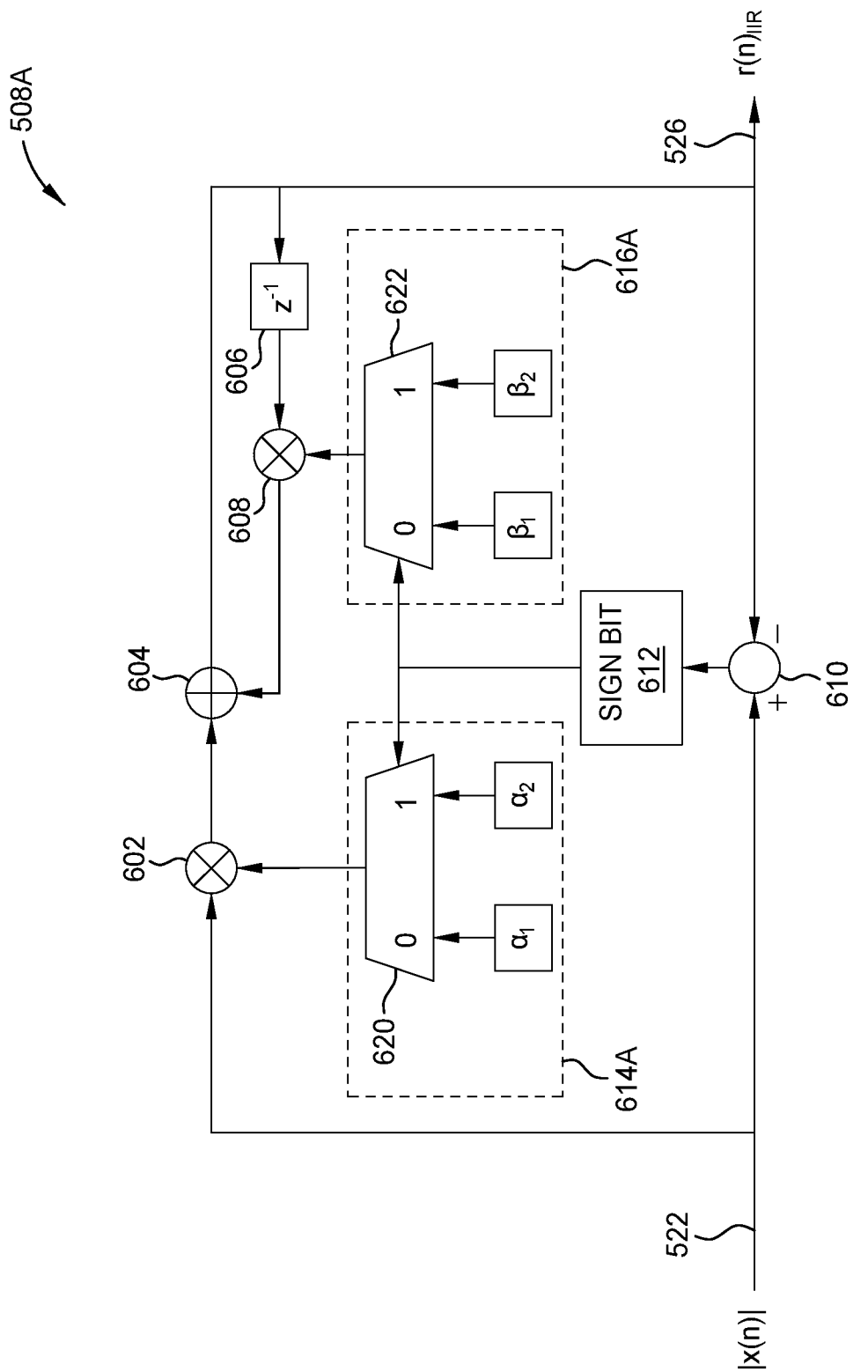
FIGS. 7, 8, and 9 are schematics of example infinite impulse response (IIR) filters that may be implemented as an IIR filter of FIGS. 5 and 6 according to some examples.
Figure 8:
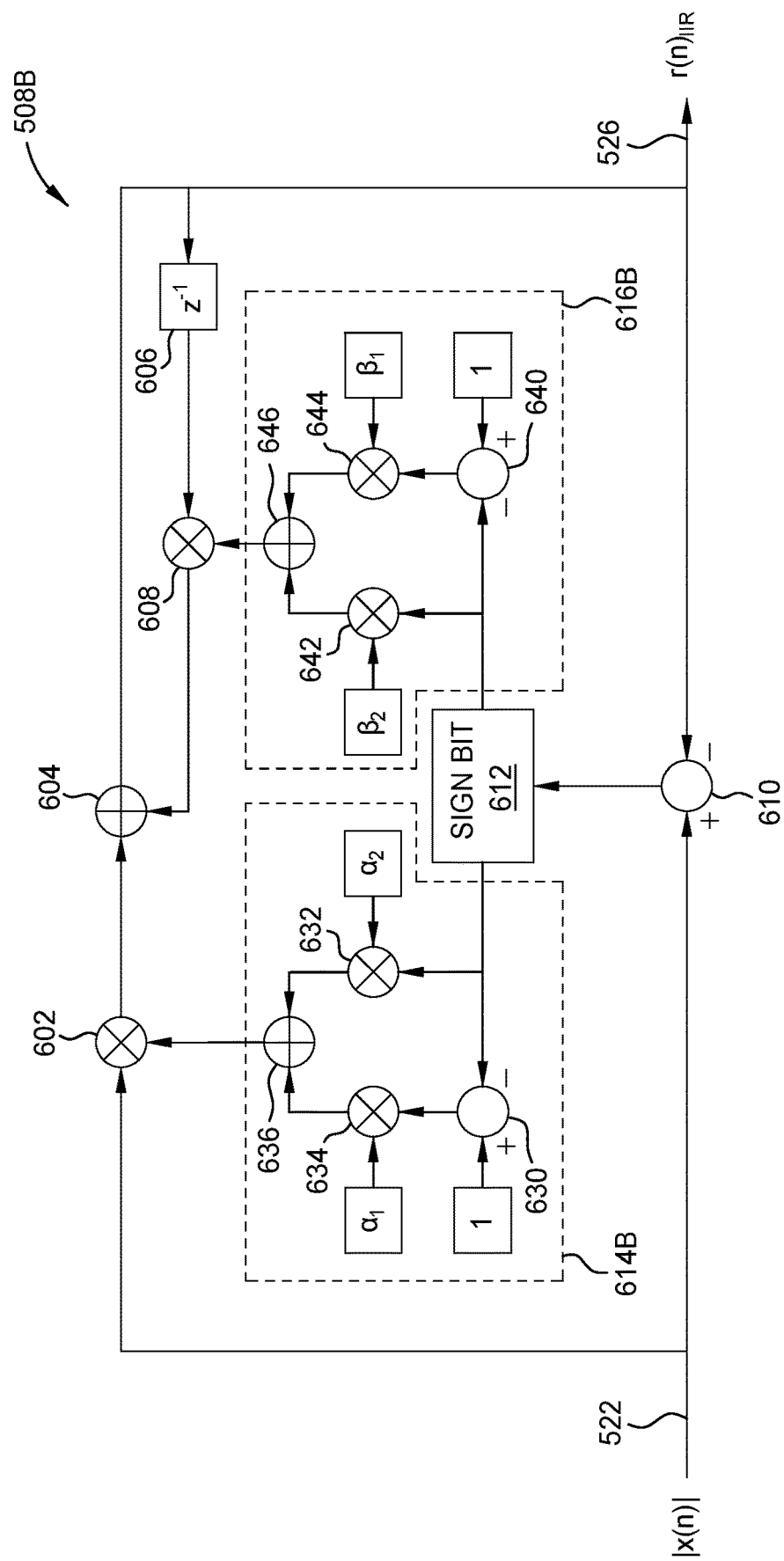
Figure 9:
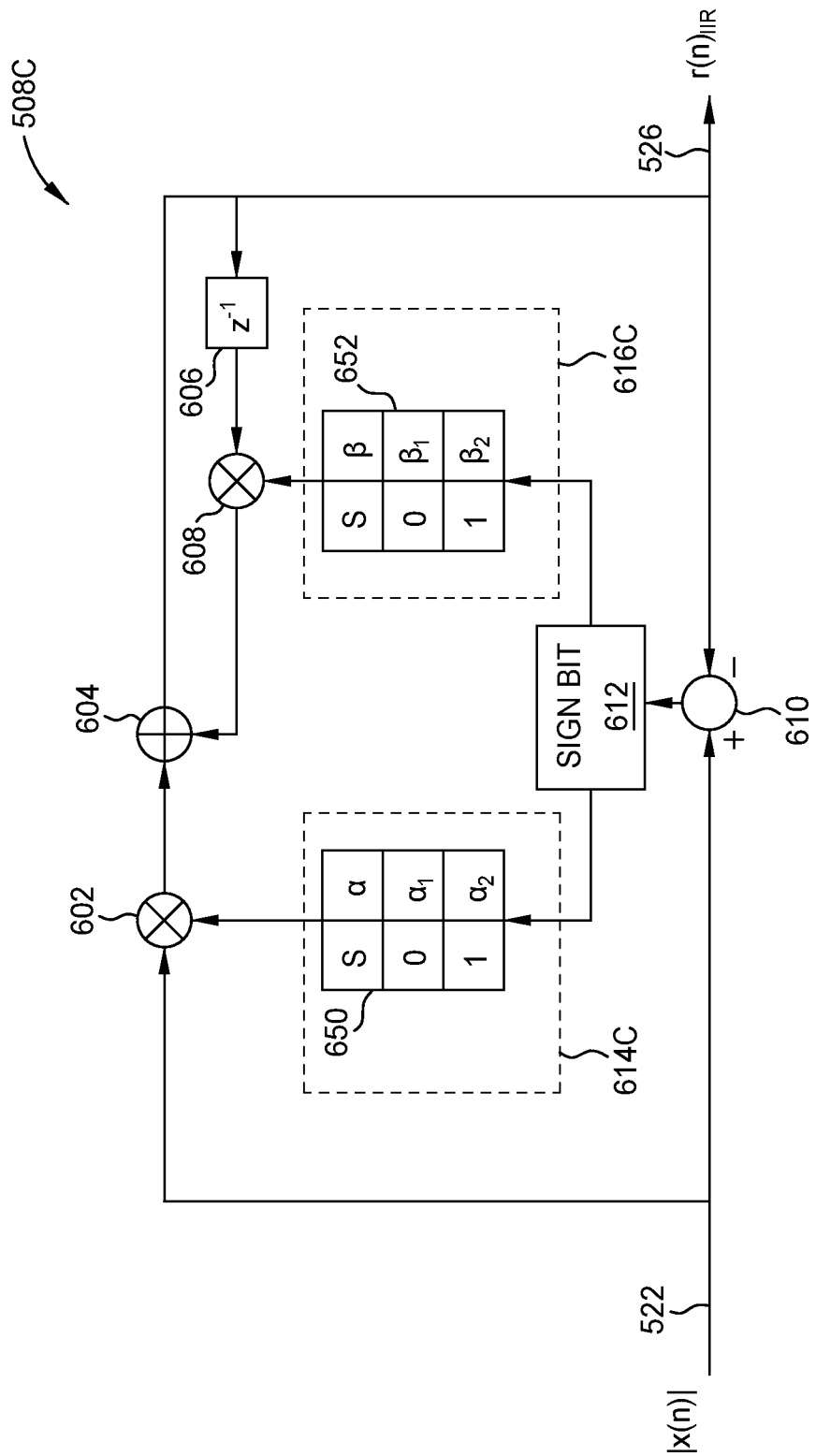

FIGS. 7, 8, and 9 illustrate example IIR filters 508A, 508B, 508C that may be implemented as an IIR filter 508 of FIGS. 5 and 6 according to some examples. The IIR filters 508A, 508B, 508C are configured to selectively implement parameters that compensate for changes of time constants in the response of the PA 206. Each of the IIR filters 508A, 508B, 508C includes first selection circuits 614A, 614B, 614C, respectively, and second selection circuits 616A, 616B, 616C, respectively. The first selection circuits 614A, 614B, 614C (collectively or individually, first selection circuit(s) 614) are each configured to selectively output a first alpha parameter $\alpha_1$ or a second alpha parameter $\alpha_2$ based on a sign bit. The second selection circuits 616A, 616B, 616C (collectively or individually, second selection circuit(s) 616) are each configured to selectively output a first beta parameter 131 or a second beta parameter 132 based on the sign bit. The selected alpha and beta parameters are then implemented in the transfer function of the IIR filter.

Aspects common to FIGS. 7, 8, and 9 are described followed by description of various selection circuits implemented in each example. Each of the IIR filters 508A, 508B, 508C include a multiplier 602, an adder 604, a delay unit 606, a multiplier 608, a subtractor 610, a sign bit determination circuit 612, a first selection circuit 614, and a second selection circuit 616.

The input node 522 is coupled to an input node of the multiplier 602 and a positive input node of the subtractor 610. An output node of the first selection circuit 614 is coupled to another input node of the multiplier 602. An output node of the multiplier 602 is coupled to an input node of the adder 604. An output node of the adder 604 is coupled to an input node of the delay unit 606, a negative input node of the subtractor 610, and the output node 526 of the IIR filter 508. An output node of the delay unit 606 is coupled to an input node of the multiplier 608. An output node of the second selection circuit 616 is coupled to another input node of the multiplier 608. An output node of the multiplier 608 is coupled to another input node of the adder 604. An output node of the subtractor 610 is coupled to an input node of the sign bit determination circuit 612, and an output node of the sign bit determination circuit 612 is coupled to control input nodes of the first selection circuit 614 and the second selection circuit 616.

In operation, the IIR filter 508 receives the magnitude signal $|x(n)|$ on the input node 522, and the magnitude signal $|x(n)|$ is input to the multiplier 602 and the subtractor 610. The first selection circuit 614 is configured to output a selected alpha parameter $\alpha$ to the multiplier 602, and the multiplier 602 is configured to multiply the magnitude signal $|x(n)|$ with the selected alpha parameter $\alpha$. The resulting product signal $\alpha|x(n)|$ is output to the adder 604. The output of the adder 604 is the digital response signal $r(n)_{IIR}$, which is input to the delay unit 606, input to the negative input node of the subtractor 610, and output to the output node 524. The delay unit 606 is configured to delay the digital response signal $r(n)_{IIR}$ one or more time periods, which, in the illustrated examples, is one time period $z^{-1}$. The delay unit 606 is configured to output the delayed response signal $r(n)_{IIR}*z^{-1}$ to the multiplier 608. The delay unit 606 (and any delay unit described subsequently) can include one or more buffers, one or more flip-flops, or the like, which further can have multiple taps that are selectable to output a signal with a desired delay. The second selection circuit 616 is configured to output a selected beta parameter $\beta$ to the multiplier 608, and the multiplier 608 is configured to multiply the delayed response signal $r(n)_{IIR}*z^{-1}$ with the selected beta parameter $\beta$. The resulting product signal $\beta*r(n)_{IIR}*z^{-1}$ is output to the adder 604, which is configured to add the product signal $\alpha*|x(n)|$ to the product signal $\beta*r(n)_{IIR}*z^{-1}$. The general transfer function of the IIR filter 508 can be expressed as follows:

$$H(z) = \frac{\alpha}{1 - \beta z^{-1}}$$

The subtractor 610 is configured to subtract the digital response signal $r(n)_{IIR}$ from the magnitude signal $|x(n)|$ to obtain a difference signal $|x(n)|-r(n)_{IIR}$, and to output the difference signal $|x(n)|-r(n)_{IIR}$ to the sign bit determination circuit 612. The sign bit determination circuit 612 is configured to identify and output the sign bit of the difference signal $|x(n)|-r(n)_{IIR}$ to the first selection circuit 614 and the second selection circuit 616. The sign bit determination circuit 612 can be any connection and/or logic (e.g., a comparator) that propagates the sign bit of the difference signal $|x(n)|-r(n)_{IIR}$. Hence, when the magnitude signal $|x(n)|$ is greater than the digital response signal $r(n)_{IIR}$, the sign bit of the difference signal $|x(n)|-r(n)_{IIR}$ is "0", which is output to the first selection circuit 614 and the second selection circuit 616. When the digital response signal $r(n)_{IIR}$ is greater than the magnitude signal $|x(n)|$, the sign bit of the difference signal $|x(n)|-r(n)_{IIR}$ is "1", which is output to the first selection circuit 614 and the second selection circuit 616.

The first selection circuit 614 is configured to selectively output (as the selected alpha parameter $\alpha$) a first alpha parameter $\alpha_1$ or a second alpha parameter $\alpha_2$ based on whether the sign bit output by the sign bit determination circuit 612 is "0" or "1". Similarly, the second selection circuit 616 is configured to selectively output (as the selected beta parameter $\beta$) a first beta parameter $\beta_1$ or a second beta parameter $\beta_2$ based on whether the sign bit output by the sign bit determination circuit 612 is "0" or "1". When the sign bit is "0", the first selection circuit 614 and the second selection circuit 616 output the first alpha and beta parameters $\alpha_1$, $\beta_1$, respectively. When the sign bit is "1", the first selection circuit 614 and the second selection circuit 616 output the second alpha and beta parameters $\alpha_2$, $\beta_2$, respectively. Other configurations can be implemented, such as by switching when parameters are selectively output.

As indicated, the sign bit is "0" when the magnitude signal $|x(n)|$ is greater than the digital response signal $r(n)_{IIR}$, which further indicates that the PA 206 will be in a charging mode with respect to the gate-lag model and the drain-lag model. Hence, the first alpha parameter $\alpha_1$ that is output when the sign bit is "0" corresponds to the time constant of the charging mode (e.g., $\tau=\tau_{CHA}=R_{CHA}*C$, with values of $R_{CHA}$ and C depending on whether the IIR filter is modeled for the gate-lag model or the drain-lag model). The first beta parameter $\beta_1$ is one minus the first alpha parameter $\alpha_1$ (e.g., 1-$\alpha_1$). The first alpha and beta parameters $\alpha_1$, $\beta_1$ can be a function of the time constant $\tau_{CHA}$ and a sampling frequency fs of the digital input signal x(n), such as expressed below:

$$\alpha_1 = \frac{1}{f_s \tau_{CHA}}$$

$$\beta_1 = 1 - \alpha_1$$

Also, as indicated, the sign bit is "1" when the digital response signal $r(n)_{IIR}$ is greater than the magnitude signal |x(n)|, which further indicates that the PA 206 will be in an emission mode with respect to the gate-lag model and the drain-lag model. Hence, the second alpha parameter $\alpha_2$ that is output when the sign bit is "1" corresponds to the time constant of the emission mode (e.g., $\tau=\tau_{EMI}=(R_{CHA}\|R_{EMI})*C$ or $\tau=\tau_{EMI}=R_{EMI}*C$, depending on whether the IIR filter is modeled for the gate-lag model or the drain-lag model, respectively). The second beta parameter $\beta_2$ is one minus the second alpha parameter $\alpha_2$ (e.g., 1-$\alpha_2$). The second alpha and beta parameters $\alpha_2$, $\beta_2$ can be a function of the time constant $\tau_{EMI}$ and the sampling frequency fs of the digital input signal x(n), such as expressed below:

$$\alpha_2 = \frac{1}{f_s \tau_{EMI}}$$

$$\beta_2 = 1 - \alpha_2$$

Accordingly, by selectively outputting the first or second alpha parameters $\alpha_1$, $\alpha_2$ as the selected alpha parameter $\alpha$ implements the parameter that is output in the transfer function of the IIR filter, which is configured to compensate for the different time constants of the charging mode and emission mode of the given model. Similarly, by selectively outputting the first or second beta parameters $\beta_1$, $\beta_2$ as the selected beta parameter $\beta$ implements the parameter that is output in the transfer function of the IIR filter, which is configured to compensate for the different time constants of the charging mode and emission mode of the given model.

Referring to FIG. 7, the first selection circuit 614A includes a multiplexer 620, and the second selection circuit 616A includes a multiplexer 622. Respective control input nodes of the multiplexers 620, 622 are coupled to the output node of the sign bit determination circuit 612 and receive the sign bit output by the sign bit determination circuit 612. A first input node of the multiplexer 620 is coupled to a storage element (e.g., memory, such as static random access memory (SRAM)), e.g., of the parameter buffer 214, that stores the first alpha parameter $\alpha_1$, and a second input node of the multiplexer 620 is coupled to a storage element, e.g., of the parameter buffer 214, that stores the second alpha parameter $\alpha_2$. An output node of the multiplexer 620 is the output node of the first selection circuit 614A and is coupled to the respective input node of the multiplier 602. The multiplexer 620 is configured to output the signal on the first input node of the multiplexer 620 (e.g., the first alpha parameter $\alpha_1$) when the signal on the control input node of the multiplexer 620 is "0" (e.g., when the sign bit is "0") and is configured to output the signal on the second input node of the multiplexer 620 (e.g., the second alpha parameter $\alpha_2$) when the signal on the control input node of the multiplexer 620 is "1" (e.g., when the sign bit is "1").

A first input node of the multiplexer 622 is coupled to a storage element, e.g., of the parameter buffer 214, that stores the first beta parameter $\beta_1$, and a second input node of the multiplexer 622 is coupled to a storage element, e.g., of the parameter buffer 214, that stores the second beta parameter $\beta_2$. An output node of the multiplexer 622 is the output node of the second selection circuit 616A and is coupled to the respective input node of the multiplier 608. The multiplexer 622 is configured to output the signal on the first input node of the multiplexer 622 (e.g., the first beta parameter $\beta_1$) when the signal on the control input node of the multiplexer 622 is "0" (e.g., when the sign bit is "0") and is configured to output the signal on the second input node of the multiplexer 622 (e.g., the second beta parameter $\beta_2$) when the signal on the control input node of the multiplexer 622 is "1" (e.g., when the sign bit is "1").

Referring to FIG. 8, the first selection circuit 614B includes a subtractor 630, multipliers 632, 634, and an adder 636, and the second selection circuit 616B includes a subtractor 640, multipliers 642, 644, and an adder 646. An output node of the sign bit determination circuit 612 is coupled to respective negative input nodes of subtractors 630, 640 and to respective input nodes of multipliers 632, 642. Respective positive input nodes of the subtractors 630, 640 are coupled to a "1", such as to a storage element storing a "1" or to a power node (e.g., $V_{DD}$) that is a logical "1". An output node of the subtractor 630 is coupled to an input node of the multiplier 634, and an output node of the subtractor 640 is coupled to an input node of the multiplier 644.

Another input node of the multiplier 634 is coupled to a storage element, e.g., of the parameter buffer 214, that stores the first alpha parameter $\alpha_1$, and an output node of the multiplier 634 is coupled to an input node of the adder 636. Another input node of the multiplier 632 is coupled to a storage element, e.g., of the parameter buffer 214, that stores the second alpha parameter $\alpha_2$, and an output node of the multiplier 632 is coupled to another input node of the adder 636. An output node of the adder 636 is the output node of the first selection circuit 614B and is coupled to the respective input node of the multiplier 602.

Another input node of the multiplier 644 is coupled to a storage element, e.g., of the parameter buffer 214, that stores the first beta parameter $\beta_1$, and an output node of the multiplier 644 is coupled to an input node of the adder 646. Another input node of the multiplier 642 is coupled to a storage element, e.g., of the parameter buffer 214, that stores the second beta parameter $\beta_2$, and an output node of the multiplier 642 is coupled to another input node of the adder 646. An output node of the adder 646 is the output node of the second selection circuit 616B and is coupled to the respective input node of the multiplier 608.

In operation, the sign bit is output by the sign bit determination circuit 612 to the subtractors 630, 640 and multipliers 632, 642. The subtractors 630, 640 are configured to subtract the sign bit from "1", and output the result to multipliers 634, 644. The multipliers 634, 644 are configured to multiply the output from the subtractor 630, 640 (e.g., "1" minus the sign bit) with the first alpha or beta parameter $\alpha_1$, $\beta_1$, and output the result to adder 636, 646, respectively. The multipliers 632, 642 are configured to multiply the sign bit with the second alpha or beta parameter $\alpha_2$, $\beta_2$, and output the result to adder 636, 646, respectively. The adders 636, 646 are configured to add the product of the first alpha or beta parameter $\alpha_1$, $\beta_1$ and "1" minus the sign bit to the product of the second alpha or beta parameter $\alpha_2$, $\beta_2$ and the sign bit, and output the result to multiplier 602, 608, respectively. Hence, with S being the sign bit that is equal to "0" or "1" at any instance, the output of the adder 636 can be expressed as $\alpha_1(1-S)+\alpha_2 S$, and the output of the adder 646 can be expressed as $\beta_1(1-S)+\beta_2 S$. Accordingly, when the sign bit S is "0", the adders 636, 646 output the first alpha and beta parameters $\alpha_1$, $\beta_1$, respectively, and when the sign bit S is "1", the adders 636, 646 output the second alpha and beta parameters $\alpha_2$, $\beta_2$, respectively.

Although described here as a sign bit S and one minus the sign bit (1−S), any logic that can generate a complementary bit to the sign bit can be implemented in the place of and/or in addition to the subtractors 630, 640. For example, inverters can be implemented in the place of the subtractors 630, 640.

Referring to FIG. 9, the first selection circuit 614C includes a look-up table 650, and the second selection circuit 616C includes a look-up table 652. Respective input nodes of the look-up tables 650, 652 are coupled to an output node of the sign bit determination circuit 612. An output node of the look-up table 650 is the output node of the first selection circuit 614C and is coupled to the respective input node of the multiplier 602. An output node of the look-up table 652 is the output node of the second selection circuit 616C and is coupled to the respective input node of the multiplier 608.

The look-up table 650 can include storage elements, e.g., of the parameter buffer 214, that store the first and second alpha parameters $\alpha_1$, $\alpha_2$. The look-up table 650 is configured to selectively output the first or second alpha parameters $\alpha_1$, $\alpha_2$ based on the sign bit S received from the sign bit determination circuit 612. The first alpha parameters $\alpha_1$ is selectively output from the look-up table 650 when the sign bit S is "0", and the second alpha parameters $\alpha_2$ is selectively output from the look-up table 650 when the sign bit S is "1".

The look-up table 652 can include storage elements, e.g., of the parameter buffer 214, that store the first and second beta parameters $\beta_1$, $\beta_2$. The look-up table 652 is configured to selectively output the first or second beta parameters $\beta_1$, $\beta_2$ based on the sign bit S received from the sign bit determination circuit 612. The first beta parameters $\beta_1$ is selectively output from the look-up table 652 when the sign bit S is "0", and the second beta parameters $\beta_2$ is selectively output from the look-up table 652 when the sign bit S is "1".

Other example selection circuits and modifications to the above described example selection circuits are contemplated within the scope of other examples. Various other selection circuits that implement different logic can be implemented in an IIR filter according to other examples.

Additionally, other example IIR filters can be implemented with selection circuits. IIR filters can be implemented in configurations with various numbers and placements of poles and zeros with selection circuits that are configured to output parameters of the IIR filter. It is noted that while first order IIR filters are illustrated in FIGS. 7, 8, and 9, these IIR filters are merely examples. It will be understood by those skilled in the art that IIR filters of any order may be used.

In some examples, the IIR filters have long impulse responses, and therefore may be configured to model various long term memory effects of the PA 206 to compensate for those long term memory effects. Those long term memory effects may be attributed to the PA's active device's dynamic thermal effects and/or the active device's charge carrier traps. In some examples, the adaptation circuit 212 may adaptively configure the IIR filters 508 to model the long term memory effects of the PA 206 via long term memory effects parameters (e.g., parameters $\alpha_1$, $\alpha_2$, $\beta_1$, $\beta_2$) defining the IIR filters 508. The adaptation circuit 212 may determine the parameters for the IIR filters 508 using various algorithms, such as least mean square or recursive least squares algorithms.

In some examples, the adaptation circuit 212 updates the long term memory effects parameters of the IIR filters 508 at adaptation rates determined based on the stability of the IIR filters 508. The IIR filters 508 may include feedback and/or feedforward paths, and become unstable at high adaptation rates. As such, the IIR filters 508 may have adaptation rates lower than threshold adaptation rates at which those IIR filters 508 are stable. In some examples, the IIR filters 508-2, 508-3 have different adaptation rates. In some examples, the adaptation rates of the IIR filters 508 are lower than an adaptation rate for other components (e.g., DPD sub-circuits 506) of the DPD circuit 202.

Figure 10:
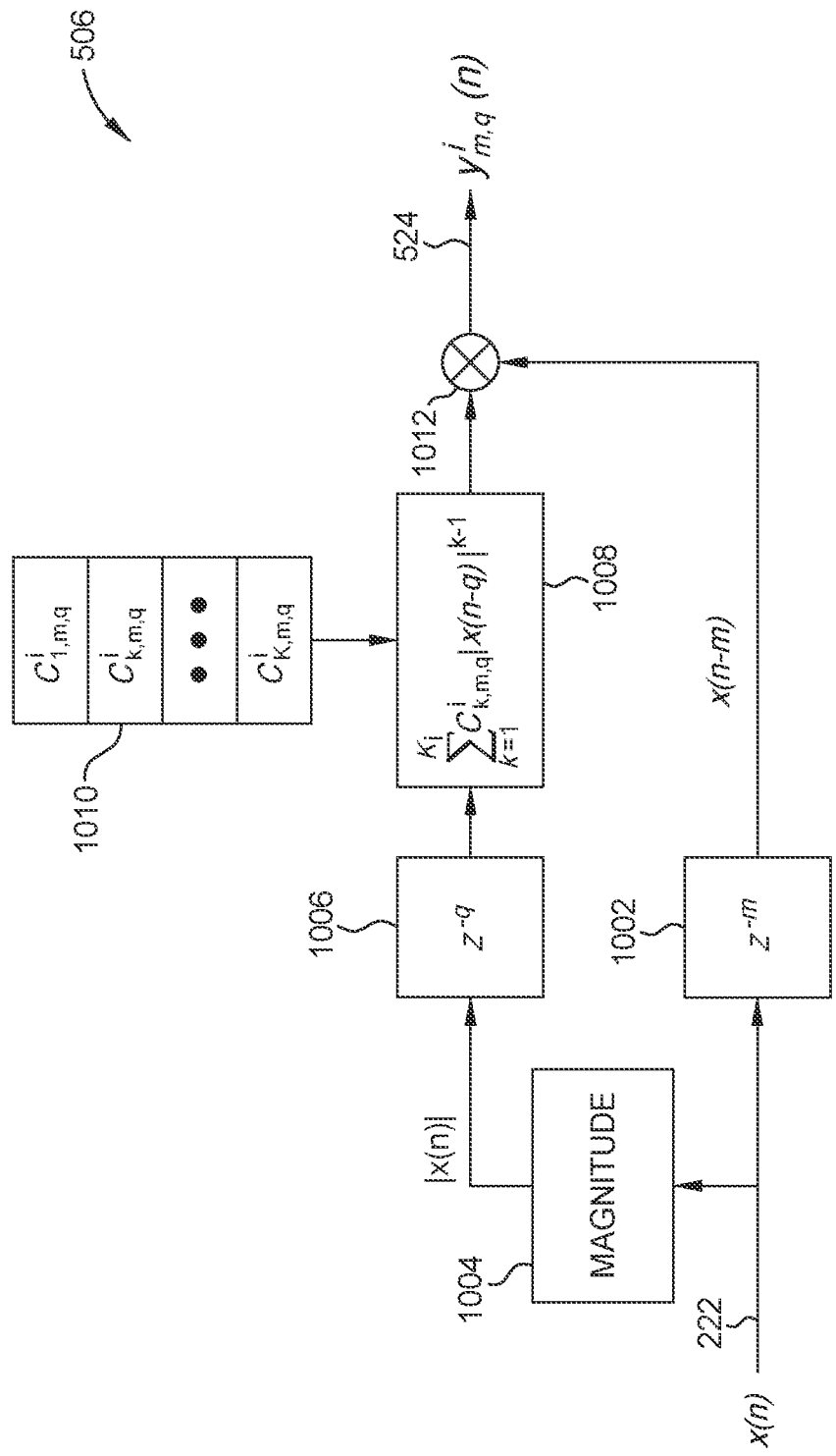
FIG. 10 is a schematic of a DPD sub-circuit according to some examples.

FIG. 10 illustrates a DPD sub-circuit 506 according to some examples. In various examples, each of DPD sub-circuits 506 may be a memoryless DPD sub-circuit or a short term memory effect DPD sub-circuit. In some examples, one or more DPD sub-circuits 506 in a DPD circuit may be a memoryless DPD path implemented based on a memoryless PA model (e.g., polynomial model or Saleh's model). In some examples, one or more DPD sub-circuits 506 in a DPD circuit may be a short term memory effect DPD path implemented based on a short term memory effect PA model, for example, a memory polynomial model or Volterra model. In some examples, the adaptation circuit 212 updates the parameters of the DPD sub-circuits 506 based on signals x(n), z(n), and/or y'(n) received by the adaptation circuit 212.

In some examples, each of the DPD sub-circuits 506 is a Volterra polynomial based non-linear function data path. A DPD sub-circuit 506 may be implemented with general memory polynomials having parameters $K_i$, $M_i$, and $Q_i$, where $K_i$ is referred to as the non-linear order of the DPD sub-circuit 506 (of index i), and $M_i$ and $Q_i$ are referred to as memory taps of the DPD sub-circuit 506 (of index i). The output distorted signal $y_{m,q}^i(n)$ of the DPD sub-circuit 506 (of index i) may be expressed, for each pair of m and q, as follows:

$$y_{m,q}^i(n) = x(n-m)\sum_{k=1}^{K_i} C_{k,m,q}^i |x(n-q)|^{k-1}$$

where k, m, and q are integers, and $k=1:K_i$, $m=1:M_i$, and $q=1:Q_i$.

The DPD sub-circuit 506 of FIG. 10 includes a delay unit 1002, magnitude logic 1004, a delay unit 1006, series logic 1008, a look-up table 1010, and a multiplier 1012. The input node 222 is coupled to respective input nodes of the delay unit 1002 and the magnitude logic 1004. An output node of the delay unit 1002 is coupled to an input node of the multiplier 1012. An output node of the magnitude logic 1004 is coupled to an input node of the delay unit 1006. An output node of the delay unit 1006 is coupled to an input node of the series logic 1008. The series logic 1008 is coupled to the look-up table 1010. An output node of the series logic 1008 is coupled to another input node of the multiplier 1012. An output node of the multiplier 1012 is the output node 524 of the DPD sub-circuit 506.

In operation, the digital input signal x(n) is received by the DPD sub-circuit 506 at input node 222 and is input to the delay unit 1002 and magnitude logic 1004. The delay unit 1002 is configured to delay the digital input signal x(n) by m time periods and output an m delayed digital signal x(n−m) to the multiplier 1012. In some examples, m is a parameter generated by the adaptation circuit 212 and stored, e.g., in the parameter buffer 214. The magnitude logic 1004 is configured to receive the digital input signal x(n), generate a magnitude signal |x(n)| that is a magnitude of the digital input signal x(n), and output the magnitude signal |x(n)| to the delay unit 1006. The delay unit 1006 is configured to receive and delay the magnitude signal |x(n)| by q time periods and output a q delayed magnitude signal |x(n−q)| to series logic 1008. In some examples, q is a parameter generated by the adaptation circuit 212 and stored, e.g., in the parameter buffer 214. The series logic 1008 is configured to receive the q delayed magnitude signal |x(n−q)|, access coefficients $C_{k,m,q}^{i}$ stored in the look-up table 1010, perform mathematical operations to obtain a series signal $$\sum_{k=1}^{K_i} C_{k,m,q}^{i} |x(n-q)|^{k-1},$$

and output the series signal to the multiplier 1012. In some examples, coefficients $C_{k,m,q}^{i}$ are parameters generated by the adaptation unit 212 and stored, e.g., in the parameter buffer 214, which forms at least part of the look-up table 1010. The multiplier 1012 is configured to receive them delayed digital signal x(n−m) and the series signal, multiply the signals, and output the output distorted signal $y_{m,q}^{i}(n)$ to the output node 524.

The DPD sub-circuit 506 can implement different or the same coefficients and/or parameters in different instances of the DPD sub-circuit 506, such as DPD sub-circuits 506-1, 506-2, 506-3. In some examples, the DPD sub-circuits 506-1, 506-2, 506-3 are based on different models and have different coefficients and parameters. Any appropriate parameters and coefficients can be implemented based on the model.

The adaptation circuit 212 can be configured to generate the parameters and coefficients of the DPD circuit 202, such as coefficients and parameters of DPD sub-circuits 506, alpha and beta parameters of IIR filters 508, and any other function circuit. The adaptation circuit 212 can implement a least squares error (LSE) algorithm to determine the coefficients and parameters. The adaptation circuit 212 can implement an iterative process, where the parameters and coefficients are initialized to some initial amount, that determines coefficients and parameters for iteratively higher orders for models. The adaptation circuit 212 can identify instances in errors between, e.g., the aligned digital output signal y'(n) and one or both of the digital input signal x(n) and digital intermediate signal z(n) (e.g., whether the error is positive or negative), to determine a charging or emission mode of the PA 206 and corresponding time constants and alpha and beta parameters for IIR filters 508.

The following describes a least squares adaptation to determine the coefficients by the adaptation circuit 212. The digital output signal y(n) (which may also be the aligned digital output signal y'(n)) can be modeled as follows:

$$y(n) = \sum_{k=1,m=0}^{K,M} C_m^k x(n-m)|x(n-m)|^{k-1}$$

The adaptation circuit 212 captures N samples of the digital input signal x(n) and the digital output signal y(n) (e.g., x(N), ..., x(1), and y(N), ..., y(1)). The above series to model y(n) can be indicated by a matric multiplication as below:

$$Y = U_x C$$

where:

$$Y = \begin{bmatrix} y(N) \\ \vdots \\ y(1) \end{bmatrix}$$

$$U_x = \begin{bmatrix} x(N) & x(N-1) & \cdots & x(N)|x(N)| & x(N-1)|x(N-1)| & \cdots & x(N-M)|x(N-M)|^{K-1} \\ & & & \cdots & & & \\ x(1) & x(0) & \cdots & x(1)|x(1)| & x(0)|x(0)| & \cdots & x(1-M)|x(1-M)|^{K-1} \end{bmatrix}$$

$$C = \begin{bmatrix} C_0^1 \\ C_1^1 \\ \vdots \\ C_0^2 \\ C_1^2 \\ \vdots \\ C_M^K \end{bmatrix}$$

The coefficients of matrix C can then be determined by multiplying the matrix inverse of the product of the complex conjugate of matrix $U_x$ and the matrix $U_x$ with the product of the complex conjugate of matrix $U_x$ and the matrix Y, as indicated below:

$$C = (U_x^H U_x)^{-1}(U_x^H Y)$$

Some examples implemented as described above realized signal improvement. As comparative examples, a GaN based PA was used with a carrier frequency of 1840 MHz, with 49 dBm at E-TM1.1, and PAR7.5 dB. The system was operated in E-TM2.0 mode. Without DPD, 64QAM EVM of 8.0% was realized. With DPD but without selectively implementing different parameters in an IIR filter as described above, 64QAM EVM of 5.4% was realized. With DPD and, further, with selectively implementing different parameters in an IIR filter as described above, 64QAM EVM of 1.3% was realized.

As further comparative examples, a GaN based PA was used with a carrier frequency of 1955 MHz, with 39 dBm at E-TM1.1, and PAR7.5 dB. The system was operated in E-TM2.0 mode. Without DPD, 64QAM EVM of 7.2% was realized. With DPD but without selectively implementing different parameters in an IIR filter as described above, 64QAM EVM of 5.4% was realized. With DPD and, further, with selectively implementing different parameters in an IIR filter as described above, 64QAM EVM of 2.3% was realized.

Various circuits and logic described above can be implemented in any circuit or system. For example, the DPD circuit 202, DAC 204, PA 206, ADC 208, alignment circuit 210, adaptation circuit 212, and parameter buffer 214 can be implemented as hardwired circuits and logic in an application specific integrated circuit (ASIC); as a system-on-chip (SoC) that includes, for example, hardwired circuit and logic and/or programmable processors or logic; and/or as a programmable logic device such as a field programmable gate array (FPGA). In some examples, the DPD circuit 202, alignment circuit 210, adaptation circuit 212, and parameter buffer 214 can be implemented, at least in part, in programmable fabric of an FPGA (e.g., a RF System-on-Chip (SoC) FPGA).

Figure 11:
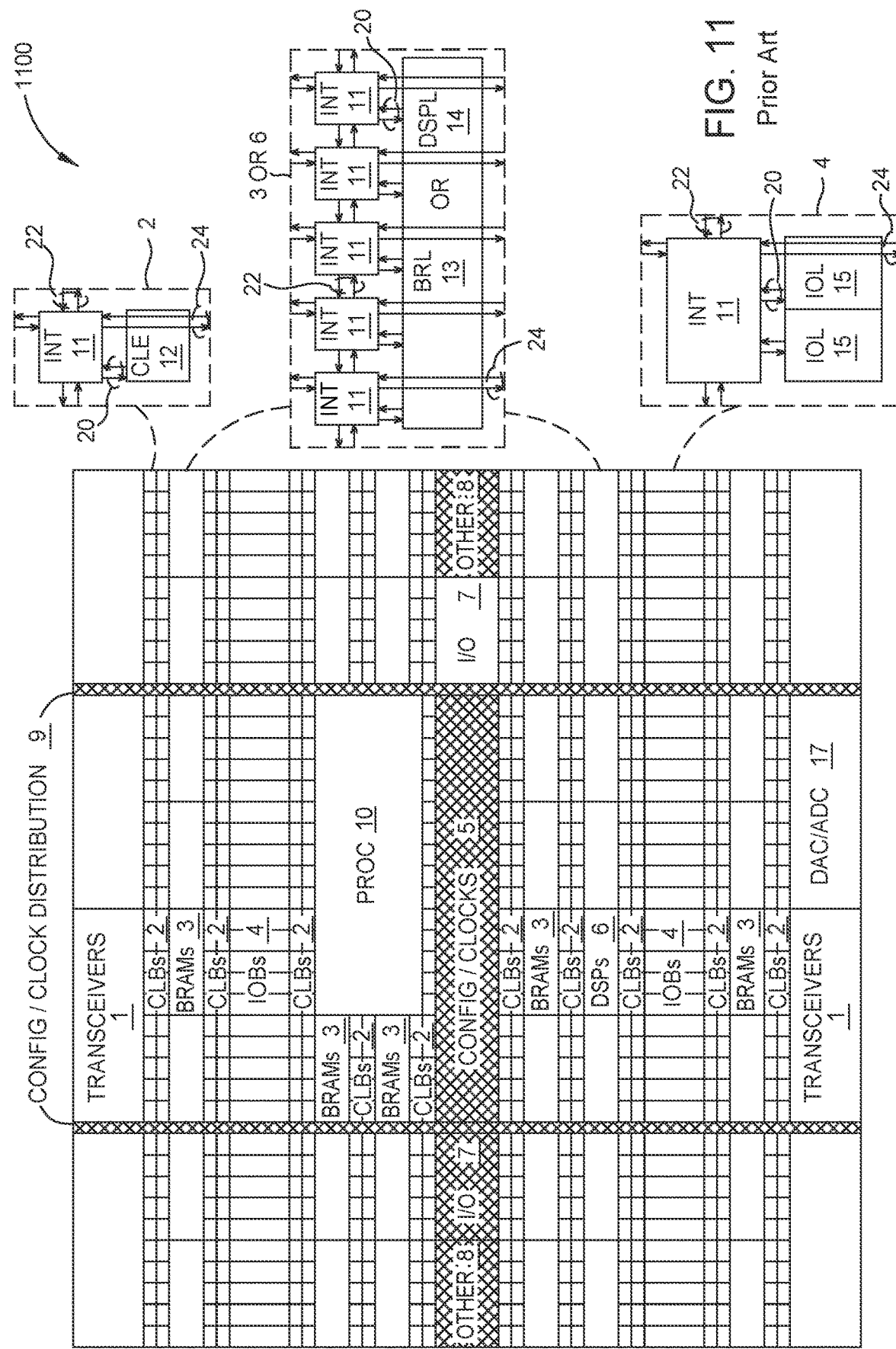
FIG. 11 is a schematic of an architecture of a field programmable gate array (FPGA) according to some examples.

FIG. 11 illustrates an architecture of FPGA 1100 that includes a large number of different programmable tiles including transceivers 1, configurable logic blocks (CLBs) 2, random access memory blocks (BRAMs) 3, input/output blocks (IOBs) 4, configuration and clocking logic (CONFIG/CLOCKS) 5, digital signal processing blocks (DSPs) 6, specialized input/output blocks (I/O) 7 (e.g., configuration ports and clock ports), and other programmable logic 8 such as digital clock managers, system monitoring logic, and so forth. Some FPGAs also include dedicated processor blocks (PROC) 10. The FPGA can also include a DAC/ADC circuitry 17 (e.g., RF-class DAC and RF-class ADC), and the like.

In some FPGAs, each programmable tile can include at least one programmable interconnect element (INT) 11 having connections to input and output terminals 20 of a programmable logic element within the same tile, as shown by examples included in FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element (CLE) 12 that can be programmed to implement user logic plus a single programmable interconnect element (INT) 11. A BRAM 3 can include a BRAM logic element (BRL) 13 in addition to one or more programmable interconnect elements. Typically, the number of interconnect elements included in a tile depends on the height of the tile. In the illustrated example, a BRAM tile has the same height as five CLBs, but other numbers (e.g., four) can also be used. A DSP 6 can include a DSP logic element (DSPL) 14 in addition to an appropriate number of programmable interconnect elements. An IOB 4 can include, for example, two instances of an input/output logic element (IOL) 15 in addition to one instance of the programmable interconnect element 11. As will be clear to those of skill in the art, the actual I/O pads connected, for example, to the input/output logic element 15 typically are not confined to the area of the input/output logic element 15.

In the pictured example, a horizontal area near the center of the die is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 11 is intended to illustrate only an example FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 12:
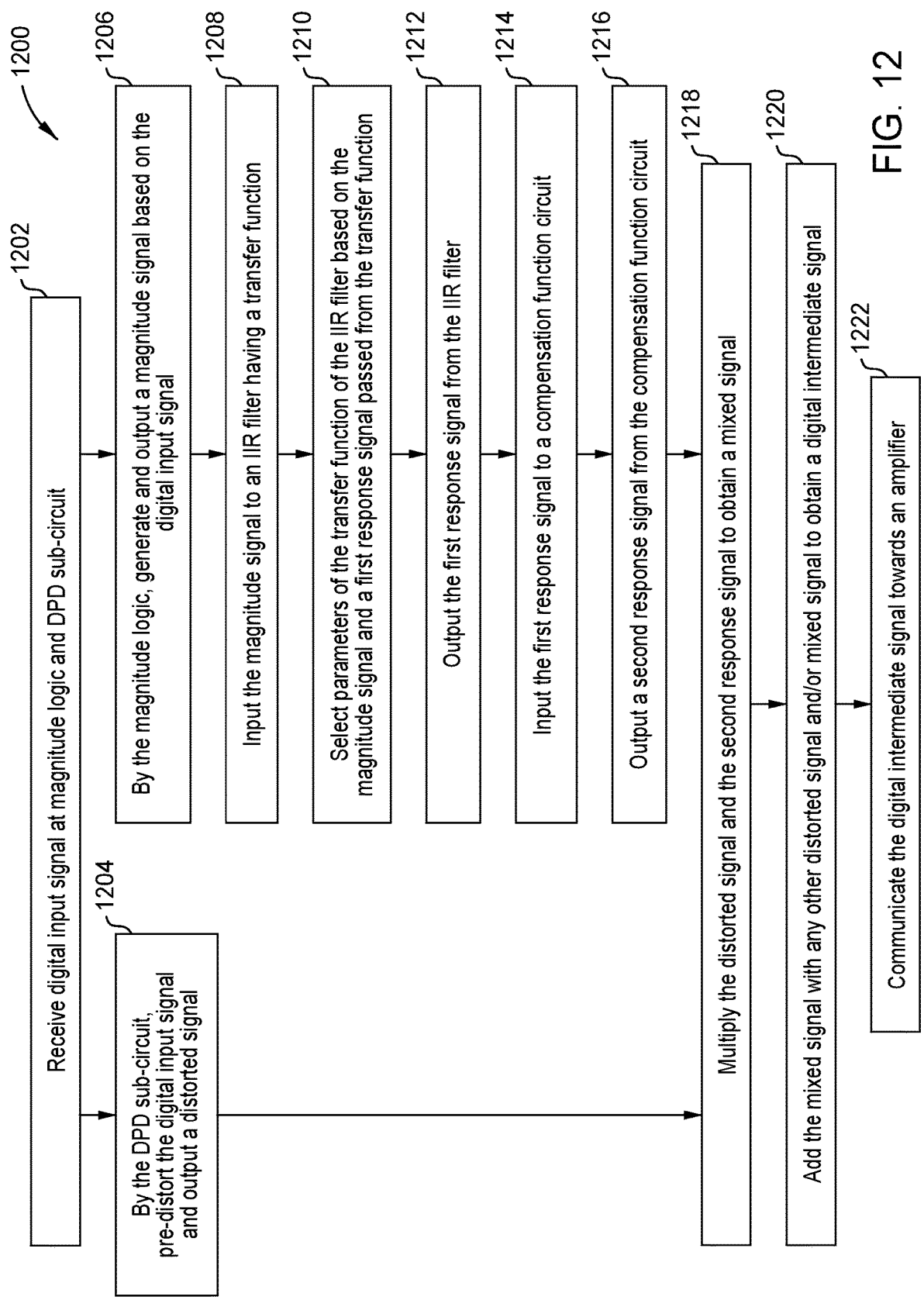
FIG. 12 is a method to process a signal to be transmitted by adding digital pre-distortion to the signal according to some examples.

FIG. 12 is a method 1200 to process a signal to be transmitted by adding digital pre-distortion to the signal according to some examples. At block 1202, a digital input signal is received at magnitude logic (e.g., magnitude logic 504) and a DPD sub-circuit (e.g., DPD sub-circuit 506). At block 1204, the digital input signal is pre-distorted by the DPD sub-circuit, and a distorted signal is output from the DPD sub-circuit. The distorted signal can be generated as described above. At block 1206, the magnitude logic generates and outputs a magnitude signal based on the digital input signal. At block 1208, the magnitude signal is input to an IIR filter (e.g., IIR filter 508) having a transfer function. At block 1210, parameters of the transfer function (e.g., alpha and beta parameters) are selected based on the magnitude signal and a first response signal passed from the transfer function. For example, as described above, alpha and beta parameters are selected using a first selection circuit 614 and a second selection circuit 616 that are configured to select an alpha and beta parameter, respectively, based on a sign bit of a difference signal that is a difference between the magnitude signal |x(n)| and the digital response signal $r(n)_{IIR}$. At block 1212, the first response signal is output from the IIR filter. At block 1214, (optionally) the first response signal is input to a compensation function circuit (e.g., compensation function circuit 510), and at block 1216, a second response signal is output from the compensation function circuit.

At block 1218, the distorted signal (output by the DPD sub-circuit) and the second response (output from the compensation function circuit) are multiplied to obtain a product signal. At block 1220, the product signal is added with any other distorted and/or product signal (e.g., from any other path) to obtain a digital intermediate signal (e.g., digital intermediate signal z(n)). At block 1222, the digital intermediate signal is communicated towards an amplifier (e.g., from the DPD circuit 202 to the PA 206).

While the foregoing is directed to specific examples, other and further examples may be devised without departing from the basic scope thereof, and the scope thereof is determined by the claims that follow.

What is claimed is:

1. A system for communications comprising:
a digital pre-distortion (DPD) circuit configured to compensate an input signal for distortions resulting from an amplifier, the DPD circuit including an infinite impulse response (IIR) filter configured to implement a transfer function, the IIR filter including a selection circuit configured to selectively output a selected parameter based on a sign bit of a signal that is a difference between a signal input to the IIR filter and a signal output from the IIR filter, the transfer function being based on the selected parameter.

2. The system of claim 1, wherein the selection circuit is configured to selectively output a first parameter or a second parameter as the selected parameter, the first parameter being based on a time constant of the amplifier in a charging mode, the second parameter being based on a time constant of the amplifier in an emission mode.

3. The system of claim 2, wherein each of the first parameter and the second parameter is further based on a gate-lag model of the amplifier.

4. The system of claim 2, wherein each of the first parameter and the second parameter is further based on a drain-lag model of the amplifier.

5. The system of claim 1, wherein the selection circuit is configured to selectively output a first parameter or a second parameter as the selected parameter, the selection circuit comprising a multiplexer having a first input node and a second input node, the first input node being coupled to a first storage element configured to store the first parameter, the second input node being coupled to a second storage element configured to store the second parameter.

6. The system of claim 1, wherein the selection circuit is configured to selectively output a first parameter or a second parameter as the selected parameter, the selection circuit comprising an adder, a first multiplier, and a second multiplier, the first multiplier being configured to multiply the first parameter with a first bit and to output a first multiplication result, the second multiplier being configured to multiply the second parameter with a second bit and to output a second multiplication result, the second bit being complementary of the first bit, the adder being configured to add the first multiplication result and the second multiplication result and to output an added result as the selected parameter.

7. The system of claim 1, wherein the selection circuit is configured to selectively output a first parameter or a second parameter as the selected parameter, the selection circuit comprising a look-up table configured to store the first parameter and the second parameter.

8. The system of claim 1, wherein the DPD circuit is implemented in programmable logic of a field programmable gate array (FPGA).

9. A method of processing for transmission, the method comprising:
performing digital pre-distortion on an input signal, performing the digital pre-distortion comprising:
inputting a first signal through an infinite impulse response (IIR) filter, the first signal being based on the input signal; and
outputting a second signal from the IIR filter, the second signal being based on the first signal and a transfer function of the IIR filter, the IIR filter including a selection circuit configured to selectively output a selected parameter based on a sign bit of a difference signal that is a difference between the first signal and the second signal, the transfer function being based on the selected parameter; and
communicating an intermediate signal resulting from performing the digital pre-distortion towards an amplifier.

10. The method of claim 9, wherein performing the digital pre-distortion further comprises:
determining the difference signal, and, wherein the selected parameter is output for the IIR filter to implement in the transfer function based on a sign bit of the difference signal.

11. The method of claim 9, wherein the selection circuit is configured to selectively output a first parameter or a second parameter as the selected parameter, the first parameter being based on a time constant of the amplifier in a charging mode, the second parameter being based on a time constant of the amplifier in an emission mode.

12. The method of claim 11, wherein each of the first parameter and the second parameter is further based on a gate-lag model of the amplifier.

13. The method of claim 11, wherein each of the first parameter and the second parameter is further based on a drain-lag model of the amplifier.

14. A system comprising:
a digital pre-distortion (DPD) circuit configured to compensate an input signal for distortions resulting from an amplifier, the DPD circuit including a first infinite impulse response (IIR) filter configured to receive a first signal, to implement a first transfer function, and to output a second signal based on the first transfer function and the first signal, the first IIR filter including:
a first difference circuit configured to generate a first difference signal that is a difference between the first signal and the second signal; and
a first selection circuit configured to selectively output a first parameter or a second parameter as a first selected parameter based on a sign bit of the first difference signal, the first transfer function being based on the first selected parameter.

15. The system of claim 14, wherein the first parameter is based on a time constant of the amplifier in a charging mode, and the second parameter is based on a time constant of the amplifier in an emission mode.

16. The system of claim 14, wherein each of the first parameter and the second parameter is further based on a gate-lag model of the amplifier.

17. The system of claim 14, wherein each of the first parameter and the second parameter is further based on a drain-lag model of the amplifier.

18. The system of claim 14, wherein:

the first IIR filter is based on a gate-lag model of the amplifier, the first parameter being based on a time constant of the amplifier in a charging mode in the gate-lag model, the second parameter being based on a time constant of the amplifier in an emission mode in the gate-lag model;

the DPD circuit further includes a second IIR filter configured to receive a third signal, to implement a second transfer function, and to output a fourth signal based on the second transfer function and the third signal, the second IIR filter being based on a drain-lag model of the amplifier, the second IIR filter including:

- a second difference circuit configured to generate a second difference signal that is a difference between the third signal and the fourth signal; and
- a second selection circuit configured to selectively output a third parameter or a fourth parameter as a second selected parameter based on a sign bit of the second difference signal, the second transfer function being based on the second selected parameter, the third parameter being based on a time constant of the amplifier in a charging mode in the drain-lag model, the fourth parameter being based on a time constant of the amplifier in an emission mode in the drain-lag model.

* * * * *

UNITED STATES PATENT AND TRADEMARK OFFICE
CERTIFICATE OF CORRECTION

PATENT NO. : 11,356,066 B1
APPLICATION NO. : 16/903378
DATED : June 7, 2022
INVENTOR(S) : Hongzhi Zhao, Xiaohan Chen and Hemang M. Parekh It is certified that error appears in the above-identified patent and that said Letters Patent is hereby corrected as shown below:

In the Specification

Column 11, Line 32, Delete "131" and insert -- $\beta_1$ --, therefor.

Column 11, Line 32, Delete "132" and insert -- $\beta_2$ --, therefor.

Column 12, Line 01, Delete "α | x(n) |" and insert -- $\alpha^*$ | x(n) | --, therefor.

Column 13, Line 29, Delete "fs" and insert -- $f_s$ --, therefor.

Column 14, Line 21, Delete "6148" and insert -- 614B --, therefor.

Column 14, Line 23, Delete "6168" and insert -- 616B --, therefor.

Column 14, Line 43, Delete "6148" and insert -- 614B --, therefor.

Column 14, Line 54, Delete "6168" and insert -- 616B --, therefor.

Column 20, Line 12, Delete "10B" and insert -- IOB --, therefor.

Signed and Sealed this
Sixteenth Day of August, 2022

Katherine Kelly Vidal
*Director of the United States Patent and Trademark Office*